United States Patent
Saito et al.

(10) Patent No.: US 8,981,569 B2
(45) Date of Patent: Mar. 17, 2015

(54) SEMICONDUCTOR DEVICE WITH LOW RESISTANCE WIRING AND MANUFACTURING METHOD FOR THE DEVICE

(71) Applicant: Kabushiki Kaisha Toshiba, Tokyo (JP)

(72) Inventors: Tatsuro Saito, Yokohama (JP); Makoto Wada, Yokohama (JP); Atsunobu Isobayashi, Yokohama (JP); Yuichi Yamazaki, Inagi (JP); Akihiro Kajita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 13/842,787

(22) Filed: Mar. 15, 2013

(65) Prior Publication Data

US 2014/0061916 A1 Mar. 6, 2014

(30) Foreign Application Priority Data

Sep. 6, 2012 (JP) .................................. 2012-196585

(51) Int. Cl.
| | |
|---|---|
| *H01L 23/48* | (2006.01) |
| *H01L 23/522* | (2006.01) |
| *H01L 21/768* | (2006.01) |
| *H01L 21/02* | (2006.01) |
| *H01L 23/532* | (2006.01) |
| *H01L 51/00* | (2006.01) |
| *H01L 51/44* | (2006.01) |
| *B82Y 30/00* | (2011.01) |

(52) U.S. Cl.
CPC ...... *H01L 23/5226* (2013.01); *H01L 21/76841* (2013.01); *H01L 21/02606* (2013.01); *H01L 21/76877* (2013.01); *H01L 23/53276* (2013.01); *H01L 21/76883* (2013.01); *H01L 21/76834* (2013.01); *H01L 21/76838* (2013.01); *H01L 21/76843* (2013.01); *H01L 21/76868* (2013.01); *H01L 21/76876* (2013.01); *H01L 21/76879* (2013.01); *H01L 51/0045* (2013.01); *H01L 51/0048* (2013.01); *H01L 51/444* (2013.01); *B82Y 30/00* (2013.01); *H01L 2221/1094* (2013.01); *H01L 2924/0002* (2013.01)
USPC .......................... 257/774; 438/637; 438/672

(58) Field of Classification Search
USPC ................................... 257/774; 438/637, 672
See application file for complete search history.

(56) References Cited

U.S. PATENT DOCUMENTS

| | | | |
|---|---|---|---|
| 8,404,588 B2 * | 3/2013 | Kim et al. ..................... | 438/675 |
| 2012/0080662 A1 | 4/2012 | Saito et al. | |
| 2013/0228933 A1 * | 9/2013 | Narwankar et al. ........... | 257/774 |

FOREIGN PATENT DOCUMENTS

| | | |
|---|---|---|
| JP | 2009-033021 A | 2/2009 |
| JP | 2009-070911 A | 4/2009 |

(Continued)

*Primary Examiner* — David Vu
*Assistant Examiner* — Brandon Fox
(74) *Attorney, Agent, or Firm* — Holtz, Holtz, Goodman & Chick PC

(57) ABSTRACT

According to one embodiment, a semiconductor device includes an insulating film, a catalytic layer and a wiring layer. The insulating film has a hole. The catalytic layer is formed at the bottom of the hole, at the peripheral wall of the hole, and on the upper surface of the insulating film outside the hole. A contact is formed of a carbon nanotube provided on the portion of the catalytic layer at the bottom of the hole. The wiring layer is formed of graphene and provided on the catalytic layer outside the hole in contact with the carbon nanotube. The catalytic layer at the bottom of the hole is a perforated film, and the catalytic layer outside the hole is a continuous film.

21 Claims, 18 Drawing Sheets

(56) References Cited

FOREIGN PATENT DOCUMENTS

| JP | 2010-062333 A | 3/2010 |
| JP | 2010-147237 A | 7/2010 |
| JP | 2010-177405 A | 8/2010 |
| JP | 2012-054303 A | 3/2012 |

* cited by examiner

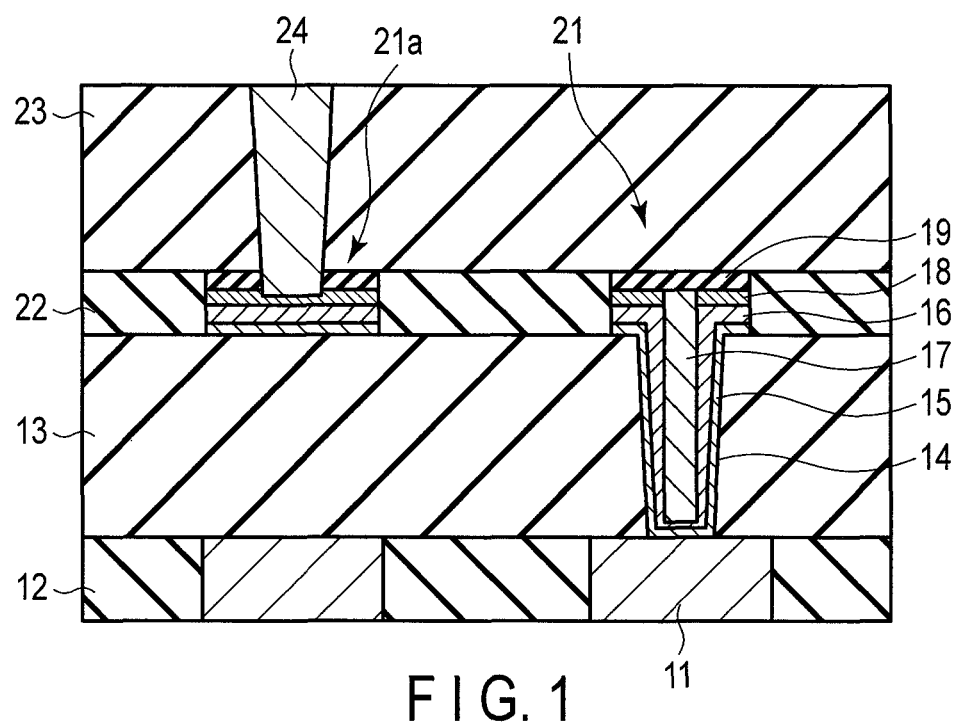
F I G. 1
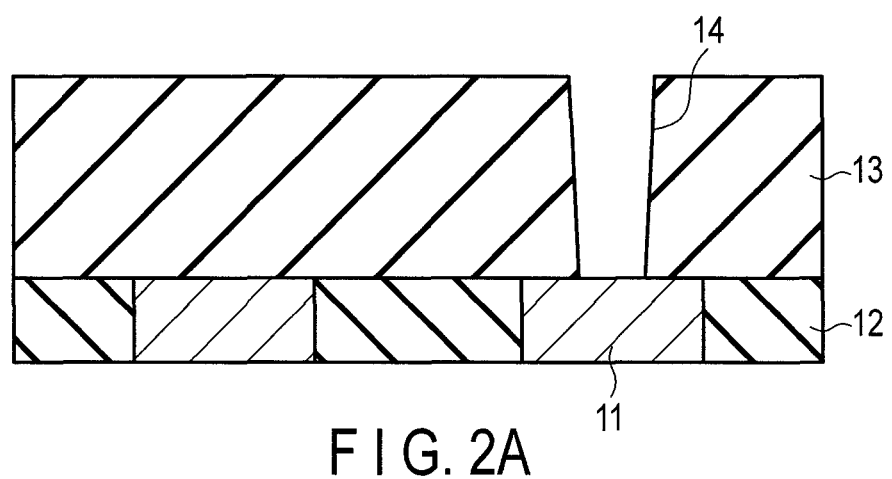
F I G. 2A

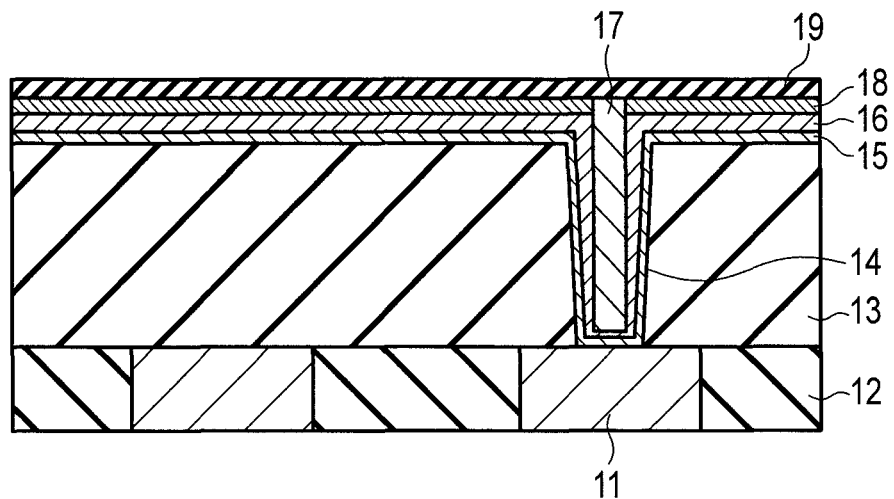
F I G. 2E
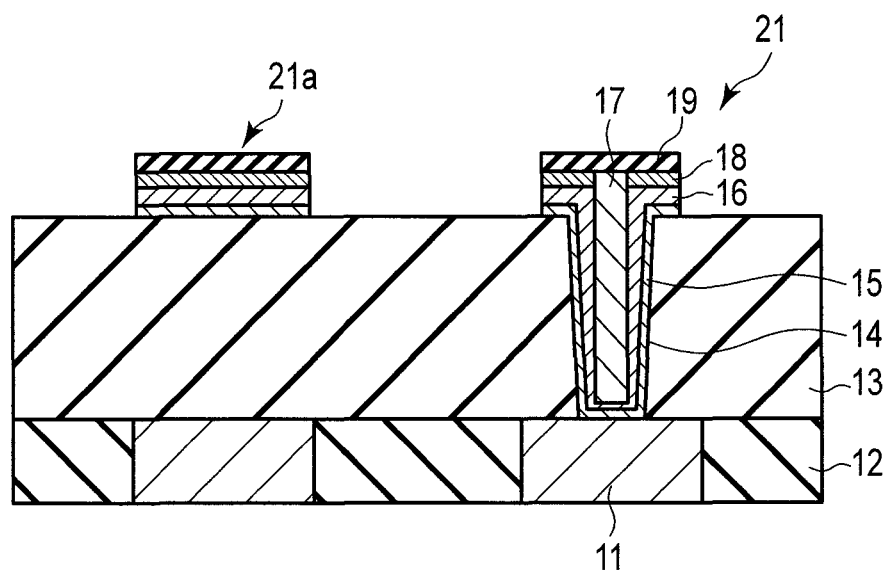
F I G. 2F

Co/TiN/Ti=1.5nm/5nm/10nm

PVD-Co catalyst (a field of less than 1.5 nm)
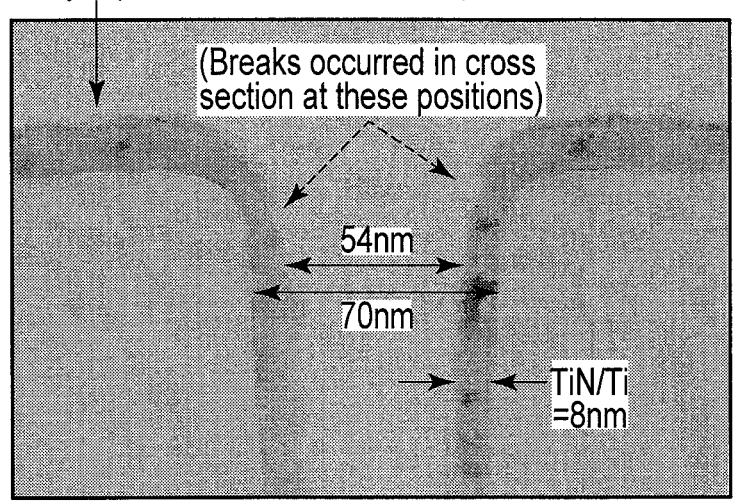
F I G. 4B
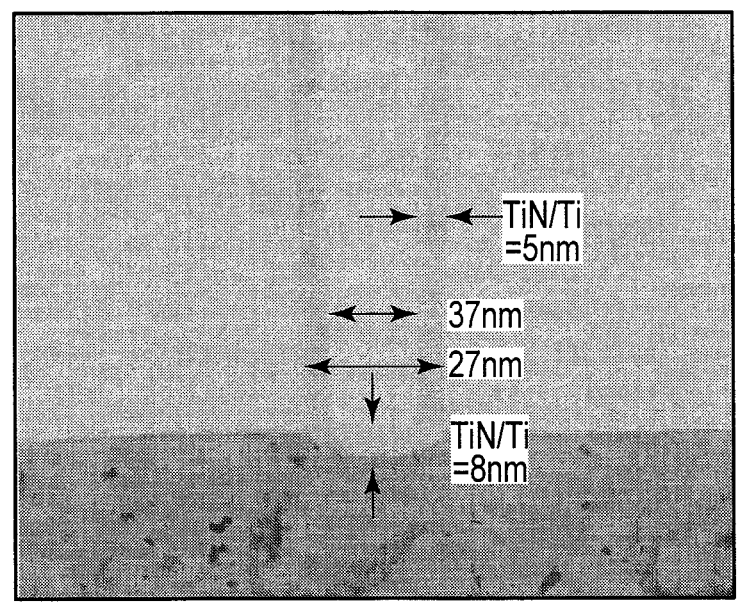
F I G. 4C

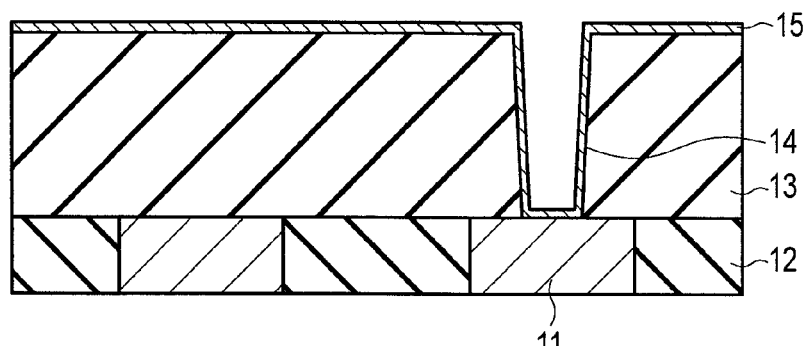
F I G. 5A
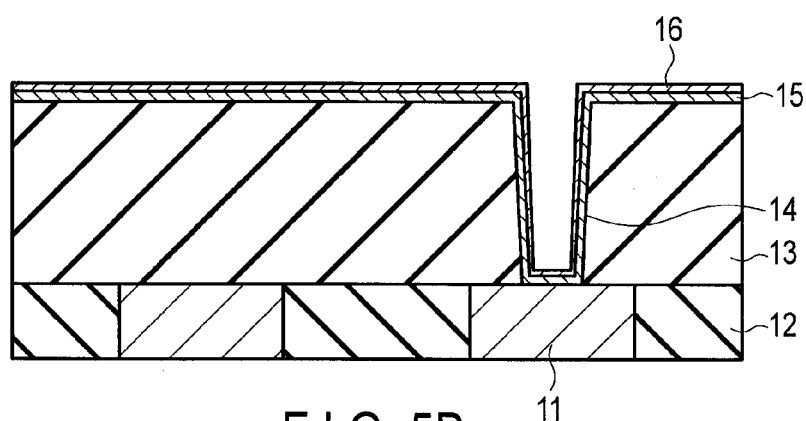
F I G. 5B
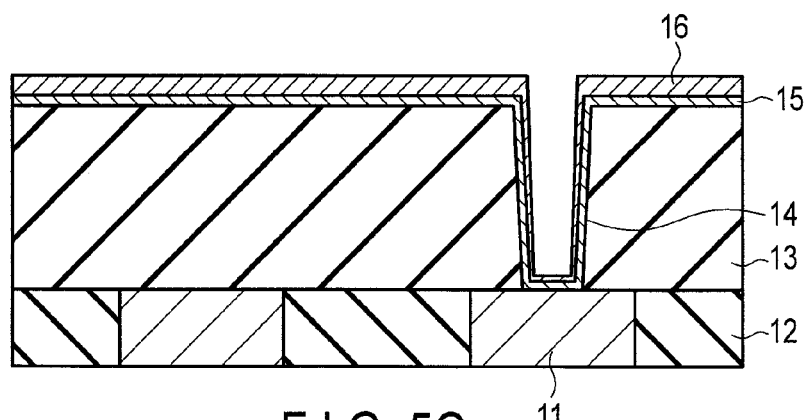
F I G. 5C

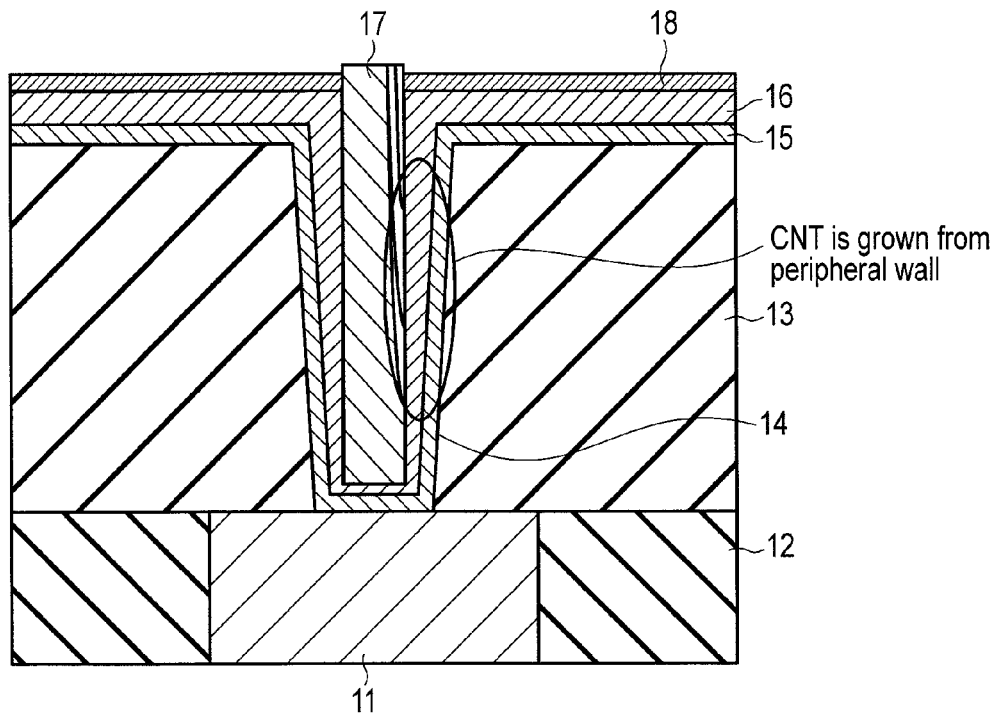
F I G. 6
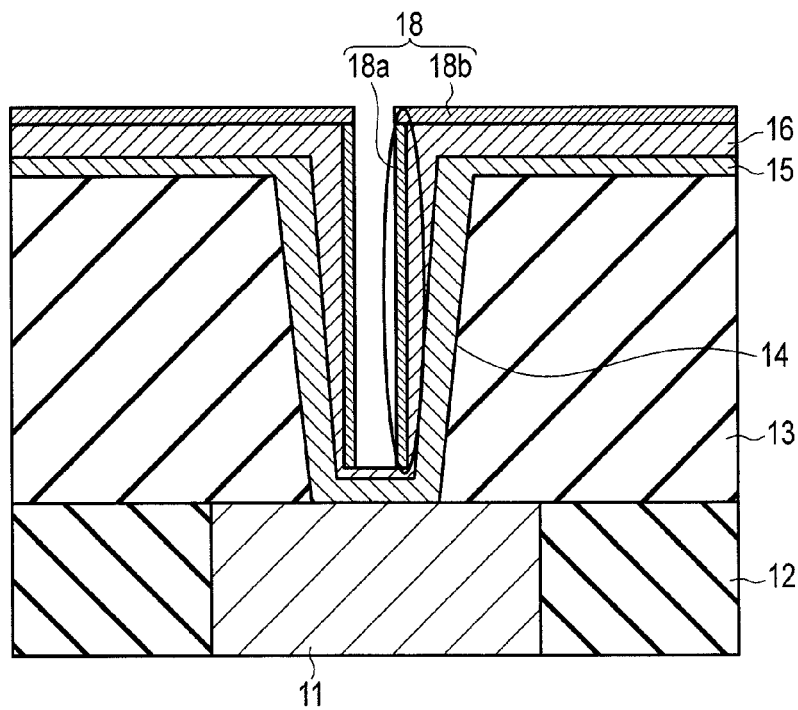
F I G. 7A

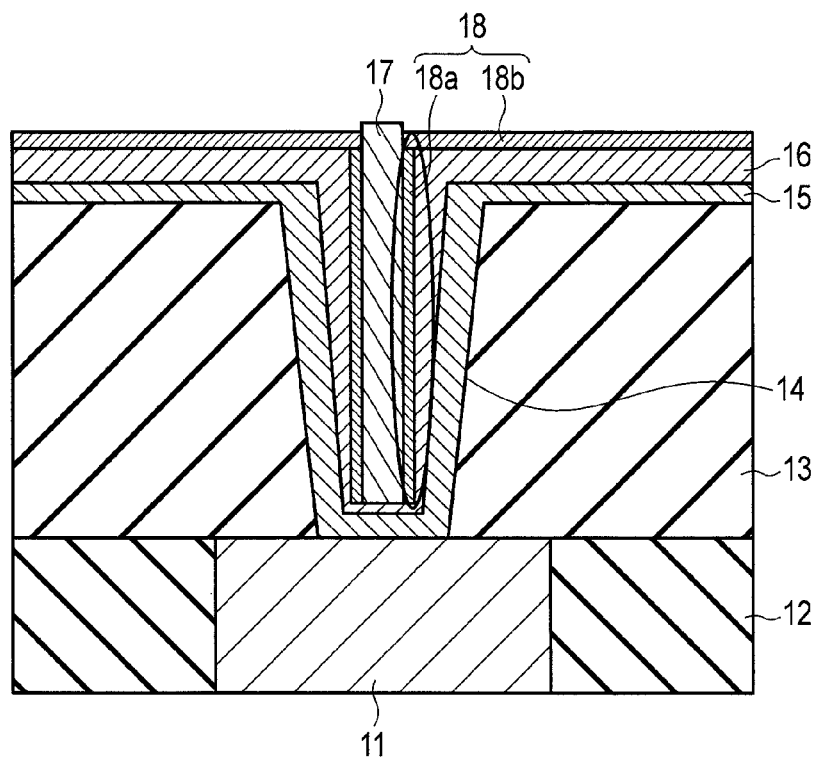
F I G. 7B
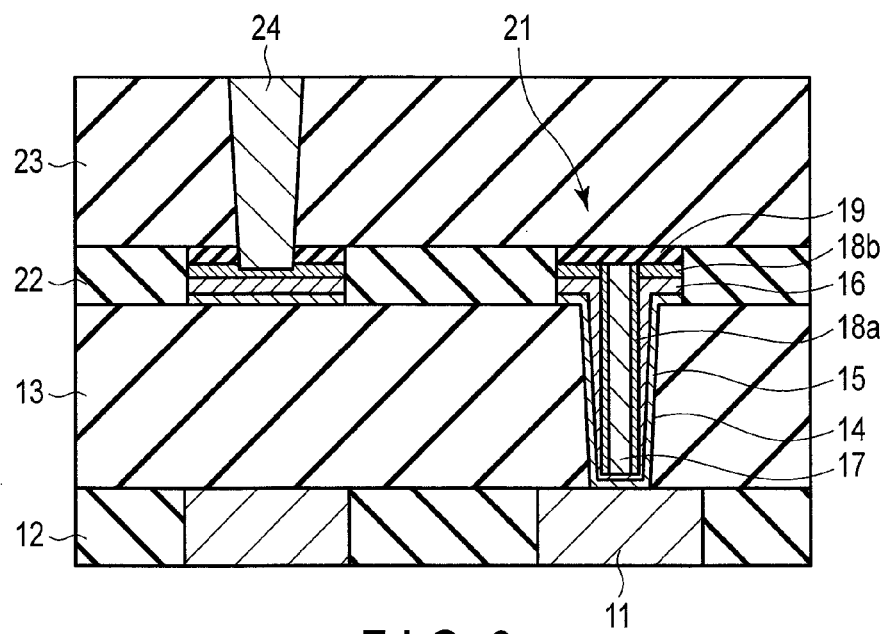
F I G. 8

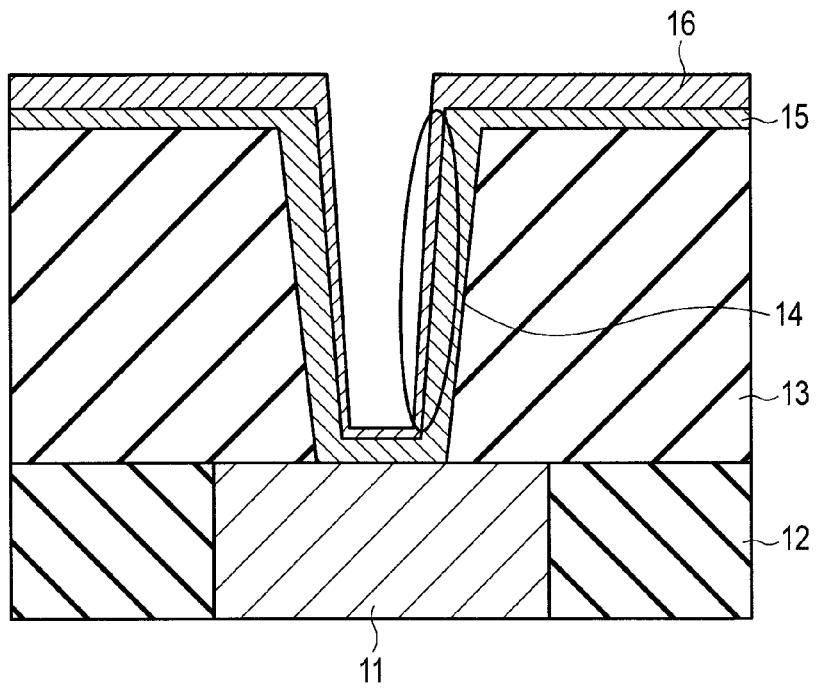
F I G. 9A
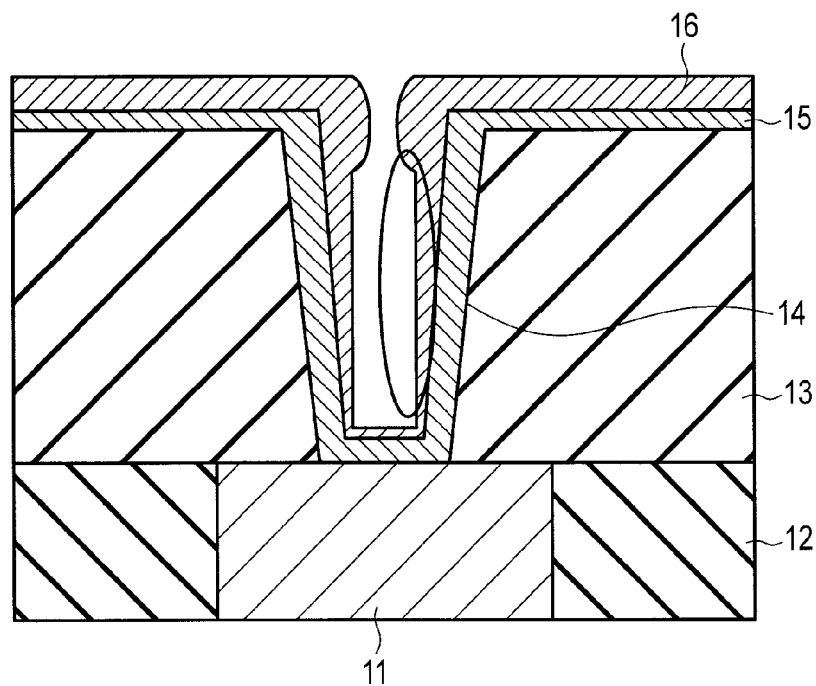
F I G. 9B

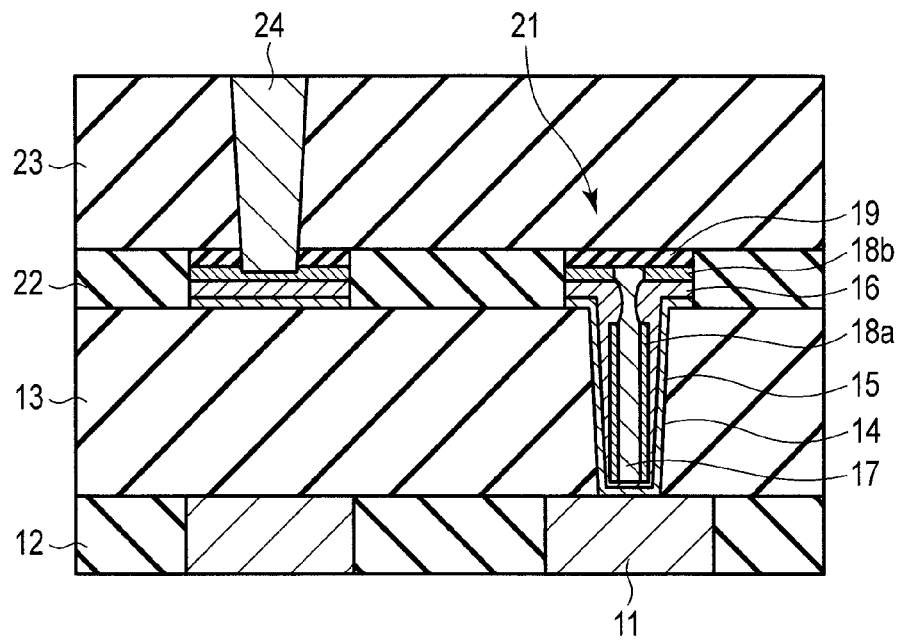
F I G. 10
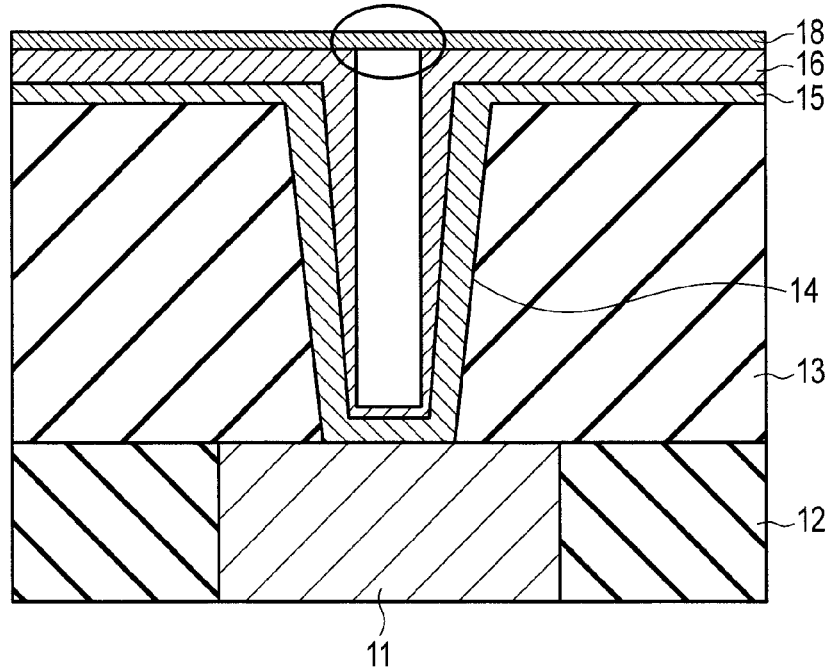
F I G. 11A

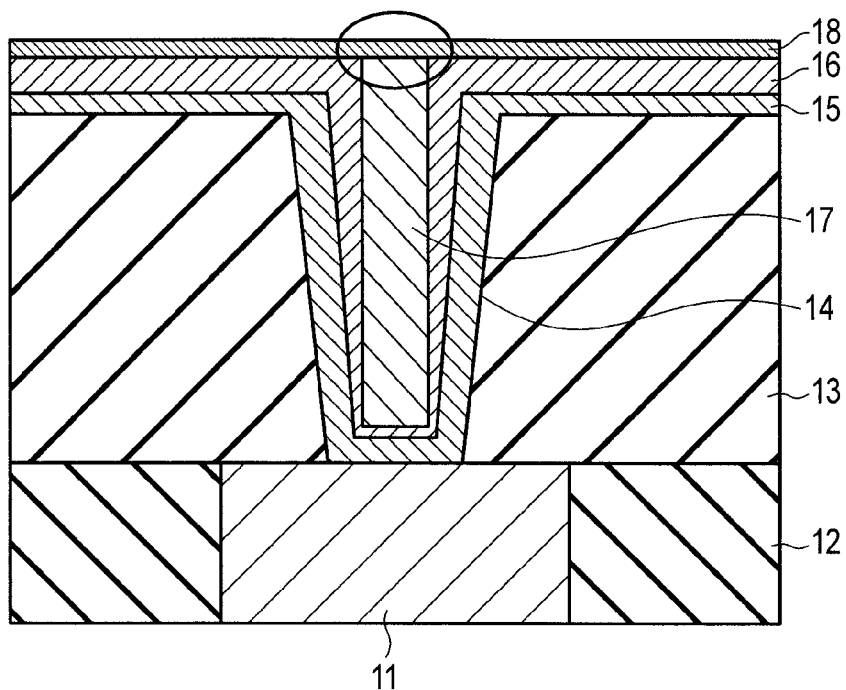
F I G. 11B
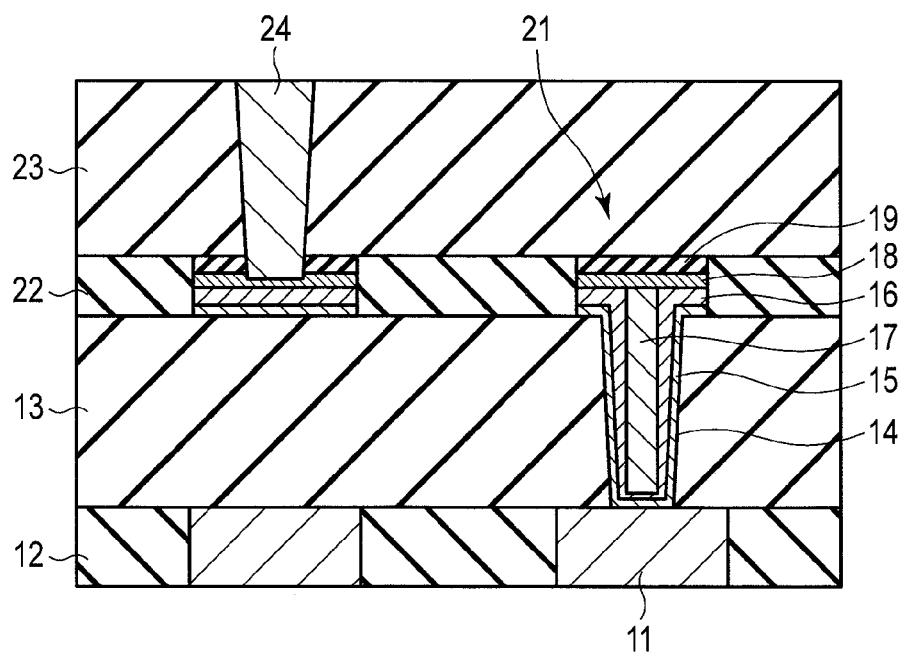
F I G. 12

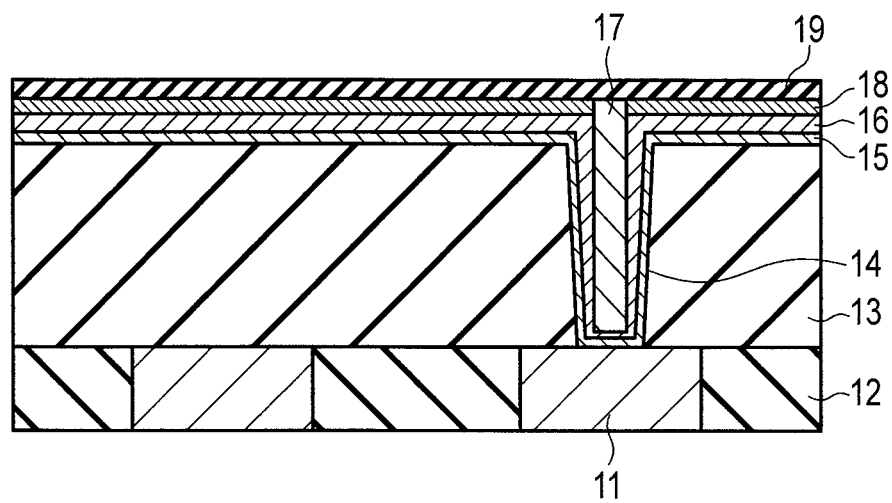
F I G. 13A
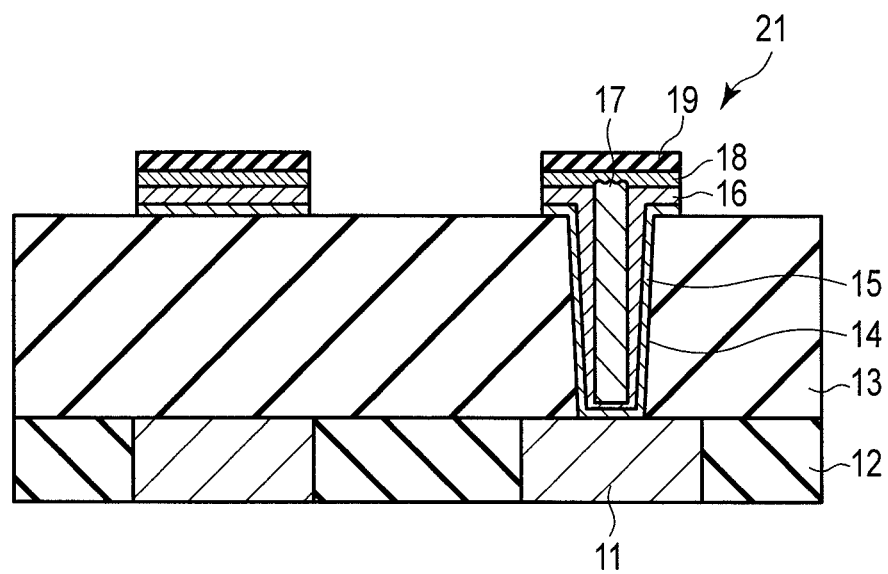
F I G. 13B

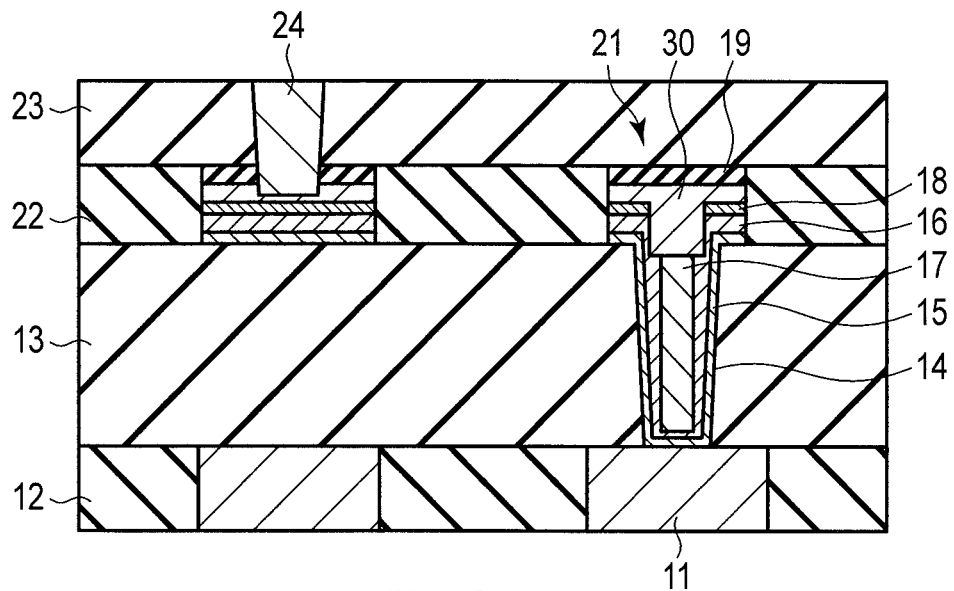
F I G. 14
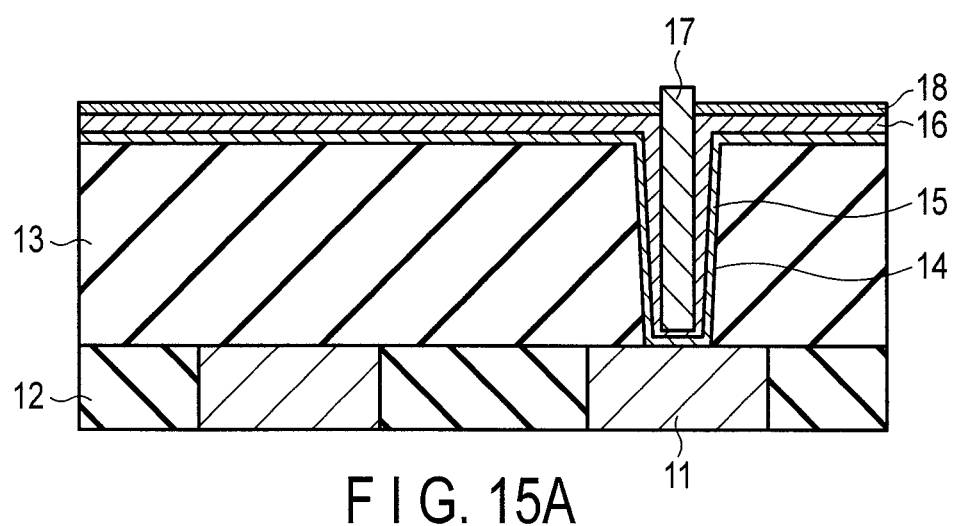
F I G. 15A

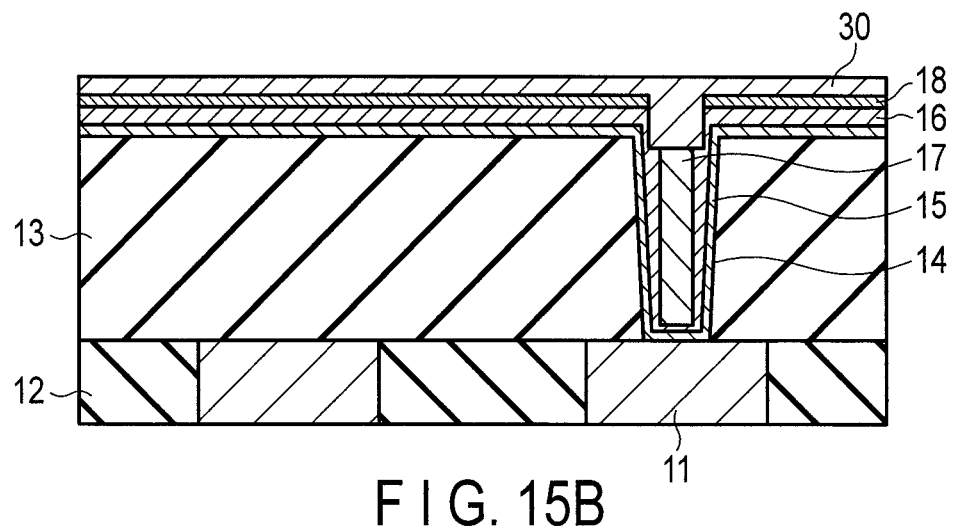
F I G. 15B
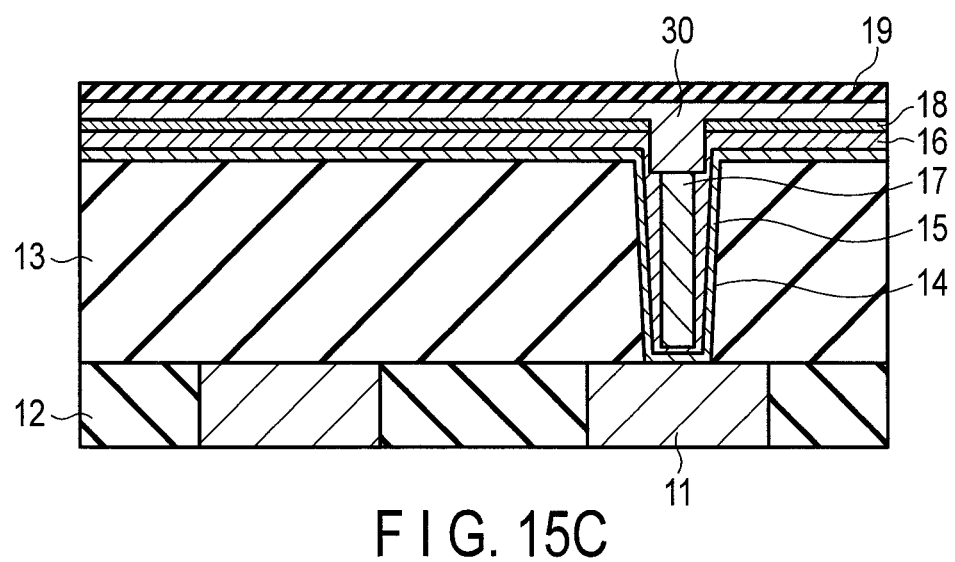
F I G. 15C

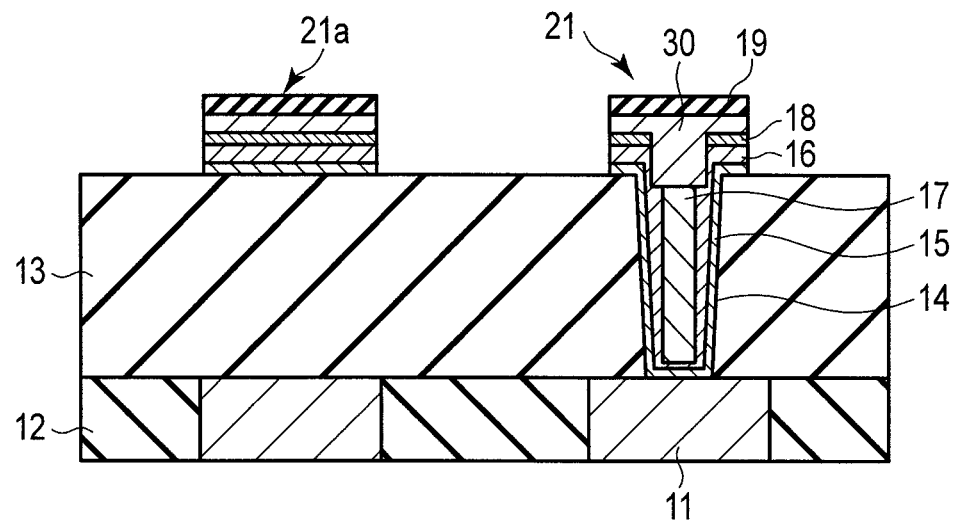
F I G. 15D
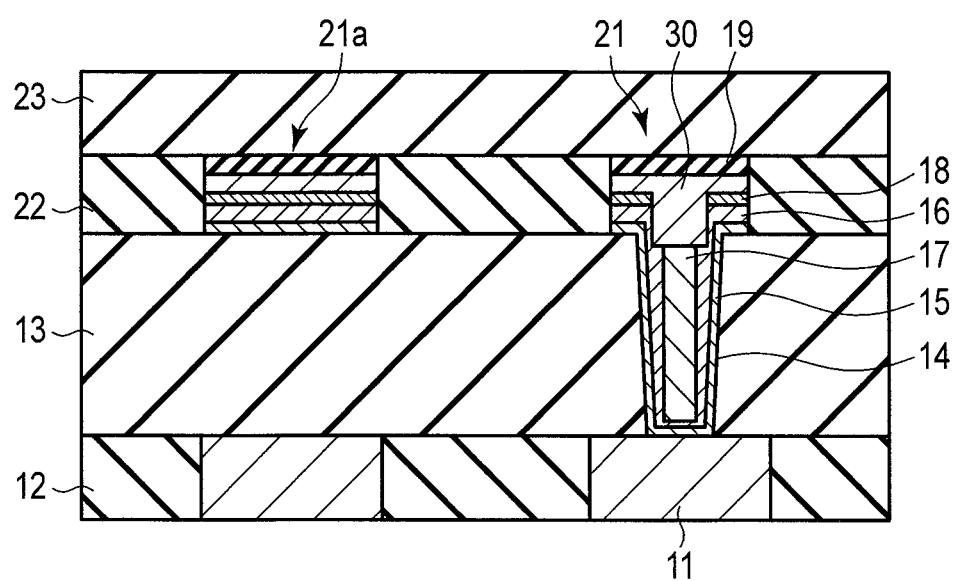
F I G. 15E

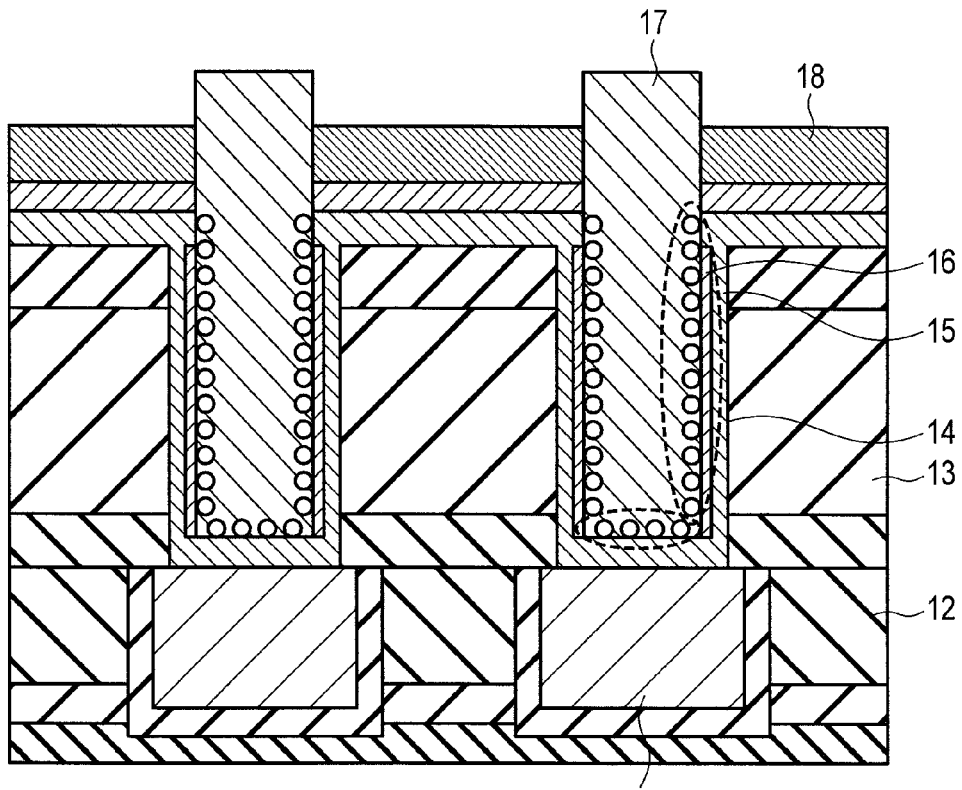
F I G. 17A
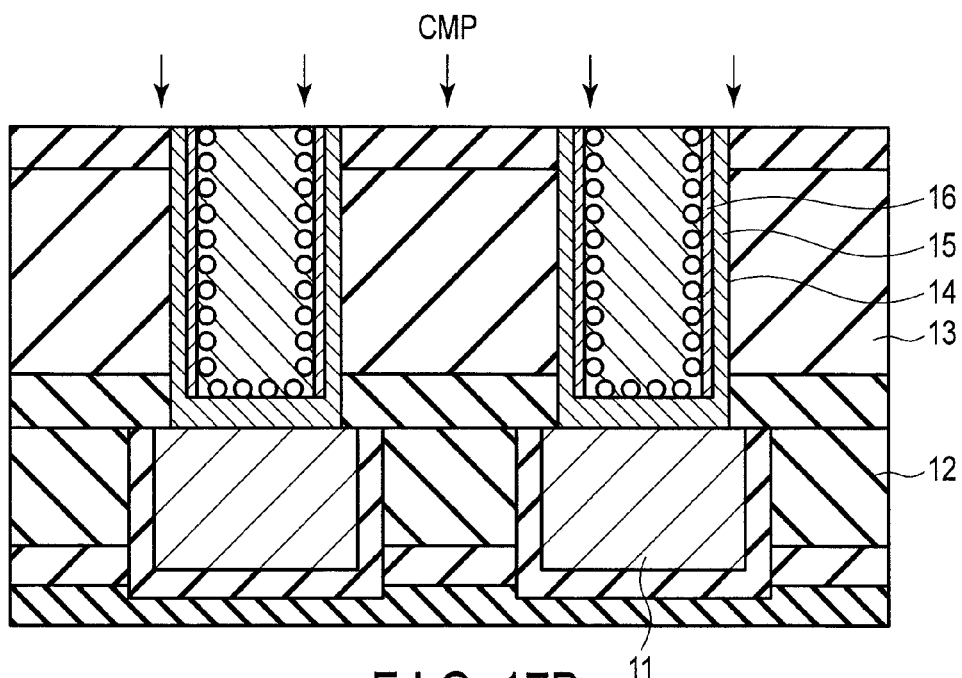
F I G. 17B

SEMICONDUCTOR DEVICE WITH LOW RESISTANCE WIRING AND MANUFACTURING METHOD FOR THE DEVICE

CROSS-REFERENCE TO RELATED APPLICATIONS

This application is based upon and claims the benefit of priority from Japanese Patent Application No. 2012-196585, filed Sep. 6, 2012, the entire contents of which are incorporated herein by reference.

FIELD

Embodiments described herein relate generally to semiconductor devices using graphene and carbon nanotubes (hereinafter referred to as CNT), and manufacturing methods for the devices.

BACKGROUND

Semiconductor devices formed using graphene and carbon nanotubes expected as low resistance wiring materials have currently been developed. In the semiconductor devices, when graphene is used as a wiring layer material and a CNT is used as a contact member, a catalytic layer, a foundation layer, etc., is inevitably interposed between the wiring layer and the contact in the prior art methods. Therefore, the contact resistance between the wiring layer and the contact is high although the materials of the wiring layer and the contact are sufficiently low in resistance, which makes it difficult to realize low resistance wiring.

BRIEF DESCRIPTION OF THE DRAWINGS

FIG. 1 is a cross sectional view illustrating a semiconductor device according to a first embodiment;

FIGS. 2A, 2B, 2C, 2D, 2E, 2F and 2G are cross sectional views illustrating a process for manufacturing the semiconductor device of the first embodiment;

FIG. 4B is an enlarged view of a portion of the electronic microscope photograph of FIG. 4A;

FIG. 4C is an enlarged view of another portion of the electronic microscope photograph of FIG. 4A;

FIGS. 5A, 5B and 5C are cross sectional views illustrating a process for forming a catalytic layer in via hole of a high aspect ratio;

FIG. 6 is a cross sectional view illustrating CNT grown from the peripheral wall of the via hole;

FIG. 7A is a cross sectional view illustrating a process according to a second embodiment;

FIG. 7B is a cross sectional view illustrating a process step subsequent to the process step of FIG. 7A;

FIG. 8 is a cross sectional view illustrating a process step subsequent to the process step of FIG. 7B;

FIG. 9A is a cross sectional view illustrating a process according to a third embodiment;

FIG. 9B is a cross sectional view illustrating a process step subsequent to the process step of FIG. 9A;

FIG. 10 is a cross sectional view illustrating a process step subsequent to the process step of FIG. 9B;

FIG. 11A is a cross sectional view illustrating a process according to a fourth embodiment;

FIG. 11B is a cross sectional view illustrating a process step subsequent to the process step of FIG. 11A;

FIG. 12 is a cross sectional view illustrating a process step subsequent to the process step of FIG. 11B;

FIG. 13A is a cross sectional view illustrating a process according to a fifth embodiment;

FIG. 13B is a cross sectional view illustrating a process step subsequent to the process step of FIG. 13A;

FIG. 14 is a cross sectional view illustrating a semiconductor device according to a sixth embodiment;

FIGS. 15A, 15B, 15C, 15D and 15E are cross sectional views illustrating a process for manufacturing the semiconductor device of the sixth embodiment;

FIG. 17A is a cross sectional view illustrating a semiconductor device according to an eighth embodiment; and FIG. 17B is a cross sectional view illustrating a process step subsequent to the process step of FIG. 17A.

DETAILED DESCRIPTION

Figure 2B:
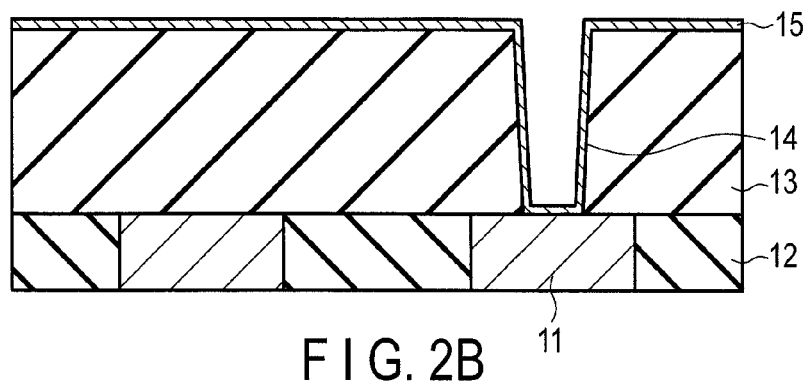

In general, according to one embodiment, a semiconductor device includes an insulating film, a catalytic layer and a wiring layer. The insulating film has a hole. The catalytic layer is formed at a bottom of the hole, at a peripheral wall of the hole, and on an upper surface of the insulating film outside the hole. A contact is formed by means of a carbon nanotube on the portion of the catalytic layer provided at the bottom of the hole. A wiring layer is formed of graphene and provided in contact with the carbon nanotube on the upper surface of a portion of the catalytic layer outside the hole. The portion of the catalytic layer provided at the bottom of the hole is a perforated film, and the portion of the catalytic layer outside the hole is a continuous film.

In micro-fabricated, thinned metal wiring used for semiconductor devices, an increase in electrical resistivity due to electron interfacial inelasticity scattering becomes conspicuous when the wiring width and height approach the mean free path of a conduction electron. For instance, the mean free path of a Cu conduction electron used as a low resistance wiring material is about 40 nm, and the electric resistivity of wiring increases when the width and height of the wiring approach 40 nm. Further, when the wiring width and height assume values not more than the mean free path of the conduction electron, an increase in electrical resistivity becomes more conspicuous.

Since delay (RC delay) of a signal passing through multilayer wiring is a significant factor for a reduction in the performance of an LSI, it is desirable to suppress an increase in wiring resistance as much as possible. However, an increase in electrical resistivity due to micro-fabrication is an inevitable problem, and for fundamental solution, it is necessary to change the material of wiring.

To this end, researches for applying, to a wiring material, a carbon material (such as fullerene) as a low resistance material in frontier devices have currently been performed actively. In particular, it has been proposed to use graphene as a material for wiring layers, and a CNT as a via material. Graphene is an extremely thin carbon material obtained by stacking about 1-100 layers of benzene rings regularly arranged in plane. In the description below, a single layer of the above-mentioned graphene will be referred to as a graphene sheet. Further, a CNT is a carbon material in which the above-mentioned graphene has a tubular structure with a diameter of one to several tens nanometers.

Graphene is expected to be used as low resistance wiring for LSIs, instead of metal wiring, by virtue of its quantization conduction characteristic. Further, since graphene has a very long Ballistic length (about 100 nm to 1 μm), it is very advantageous in long distance wiring electrical conduction. Yet further, the graphene structure itself is an extremely thin film, and can be formed by CVD. Accordingly, this material extremely matches a process for forming the lateral wiring of conventional devices.

In addition, the CNT has a quantization conduction characteristic similar to graphene, and can be formed by CVD. However, the CNT has a tubular structure unlike graphene, and therefore extremely matches a process for forming longitudinal wiring such as a contact via.

Thus, graphene and CNTs are new materials that are expected to be used as lateral wiring and longitudinal wiring, respectively, to thereby exhibit excellent electrical characteristics. Simultaneously using graphene and CNTs as lateral wiring and longitudinal wiring, respectively, can realize lower resistance wiring.

However, in the conventional wiring structure using graphene and CNT, a catalytic layer is interposed between a graphene wiring layer and a CNT contact to form them. Namely, graphene and CNTs cannot directly be kept in contact with each other.

Further, it is known that both materials exhibit a high electrical resistance when these materials are kept in contact with each other. Thus, in the conventional wiring structure using graphene and CNTs, it is difficult to realize low resistance wiring because of the contact resistance.

The embodiments described below propose a CNT-graphene wiring structure in which catalysts for graphene and CNTs are formed on contact vias and the wiring layer above the vias, and a CNT is formed in each via hole and the wiring layer is formed of graphene, thereby making the CNT and graphene in direct contact with each other between each contact via and the wiring layer.

Since the CNT and graphene have similar structures comprising benzene rings and have electrically similar characteristics, low resistance contact can be realized between a contact via and wiring by making the CNT and graphene in direct contact with each other, thereby realizing wiring that utilizes a low resistance electrical characteristic between the CNT and graphene.

Further, by simultaneously forming the contact via and the wiring, the number of process steps for manufacturing a semiconductor device can be reduced.

The embodiments will be described with reference to the accompanying drawings. In the drawings, like elements are denoted by like reference numbers.

First Embodiment

FIG. 1 shows a semiconductor device according to a first embodiment.

A wiring layer 11 formed of, for example, a metal is provided in an insulating film 12. A semiconductor substrate (not shown), on which semiconductor elements (not shown), such as a transistor and a capacitor, are formed, is provided below the insulating film 12. A contact layer (not shown) for connecting the wiring layer 11 to the semiconductor elements is formed on the semiconductor substrate. The wiring layer 11 and the insulating film 12 are formed on the contact layer.

An insulating film 13 is formed on the insulating layer 12, and a via hole 14 is formed in the insulating film 13. A catalytic foundation layer 15 is formed on the portion of the insulating film 13 that defines via hole 14, and a catalytic layer 16 is formed on the foundation layer 15.

A CNT 17 as a contact is grown from the portion of the catalytic layer 16 that is formed at the bottom of the via hole 14. The portion of the catalytic foundation layer 15 that is formed at the bottom of the via hole 14 accelerates uniform growth of the CNT 17, and the portion of the catalytic layer 16 that is at the bottom of the via hole 14 grows the CNT 17.

Further, a graphene layer 18 as a wiring layer is formed on the upper surface of the catalytic layer 16 formed on the portion of the insulating film 13 that defines the via hole 14. The portion of the catalytic foundation layer 15 that is formed on the insulating film 13 around the via hole 14 accelerates uniform growth of the graphene layer 18, and the catalytic layer 16 grows the graphene layer 18.

The upper portion of the CNT 17 grown from the bottom of the via hole 14 is in direct contact with the graphene layer 18, with no foundation layer 15 and no catalytic layer 16 interposed therebetween. This reduces the contact resistance between the CNT 17 and the graphene layer 18.

The foundation layer 15 is an auxiliary film for facilitating forming of the CNT 17 and the graphene layer 18, and prevents the material of the catalytic layer 16 from diffusing into the insulating film 13 and the contact layer 11. The catalytic foundation layer 15 can be typically formed of one of Ta, Ti, Ru, W or Al, or a nitride or oxide of one of these materials, or a laminated material including these materials.

The catalytic layer 16 is needed to form the CNT 17 and the graphene layer 18, and is preferably formed of a single metal, such as Co, Ni, Fe, Ru or Cu, or an alloy of at least two of these materials, or a carbide of these materials.

It is desirable that the catalytic layer 16 for the CNT 17 be a perforated film including dispersed film portions. When the catalytic layer 16 is formed of a perforated film, it needs to have a film thickness of less than 5 nm. In contrast, it is desirable that the catalytic layer 16 for graphene be a continuous film. When the catalytic layer 16 is formed of a continuous film, it needs to have a film thickness of not less than 5 nm. If the catalytic layer 16 is dispersed in a fine particle state, graphene cannot sufficiently grow, or a perforated graphene layer 18 may be formed. To form a uniform continuous graphene layer 18, the catalytic film must have a thickness sufficient so as to be a continuous film. For the purpose of fixing the CNT 17 formed in the contact via 14, the via hole 14 may be filled with an insulating film or a metal by CVD (chemical vapor deposition).

A gap layer 19 is formed on the graphene layer 18 serving as a wiring layer 21. The cap layer 19 prevents the wiring layer from having defects during processing the graphene layer 18.

A wiring layer 21a comprises the foundation layer 15 on the insulating film 13, the catalytic layer 16, the graphene layer 18 and the cap layer 19.

The structure on the insulating layer 13, which includes the graphene layer 18 and the cap layer 19, is insulated from other wiring layers by an insulating film 22. An insulating film 23 is formed on the resultant structure, and a contact 24 connected to, for example, the graphene layer 18 of the wiring layer 21a is formed in the insulating film 23.

To prevent the material of the catalytic layer 16 from diffusing into the insulating film 23, a diffusion barrier layer (not shown) may be formed in the insulating films 22 and 23 to coat the wiring structure. As the diffusion barrier layer, a silicon nitride film, for example, is used.

(Manufacturing Method)

Referring then to FIGS. 2A to 2G, a description will be given of a method of manufacturing the semiconductor device of the first embodiment.

Firstly, as shown in FIG. 2A, a contact layer (not shown) for connecting semiconductor elements (not shown), such as transistors and capacitors, to the wiring layer 11 is formed on a semiconductor substrate (not shown) with the semiconductor elements provided thereon, as mentioned above, and the wiring layer 11 and the insulating film 12 are formed on the contact layer.

An insulating film (not shown) providing the contact layer is formed of, for example, a TEOS film, and a contact is formed in the TEOS film. A single metal, such as W, Cu or Al, is used as the conductive material of the contact. The insulating film 12 is formed of, for example, a SiOC film.

If the CMP (chemical mechanical polishing) selection ratio of the insulating film providing the contact layer to the insulating film 12 is small, a stopper layer formed of, for example, SiCN may be formed at the bottom of the wiring layer 11. The conductive material of the wiring layer 11 is, for example, a single metal of W, Cu or Al. The above process steps are similar to those of the conventional wiring forming method.

Subsequently, the insulating film 13 is formed on the wiring layer 11 and the insulating film 12 for forming a via. The insulating film 13 is formed of, for example, SiOC. The SiOC film is formed by, for example, CVD or coating. The insulating film 13 may have fine pores for the purpose of reducing a dielectric constant.

After that, a cap film (not shown) is formed as a protection film against the reactive ion etching (RIE) damage and CMP damage of the insulating film 13. The cap film is formed of, for example, SiO$_2$ or SiOC. If the insulating film 13 is a film substantially free from the RIE damage, such as a TEOS film, or if it is an SiOC film with no fine pores, no cap film may be formed.

Thereafter, a resist (not shown) is coated, and is patterned by lithography. The patterned resist is used as a mask to etch the insulting film 13 by RIE, whereby a via hole 14 for exposing a surface portion of the wiring layer 11 is formed in the insulating film 13 as shown in FIG. 2A.

After that, as shown in FIG. 2B, the foundation layer 15 is formed by, for example, CVD, on the portion of the insulating film 13 that defines the via hole 14, and on the upper surface of the insulating film 13. The foundation layer 15 is an auxiliary film for facilitating the forming of a CNT and a graphene layer. The foundation layer 15 is typically formed of, for example, Ta, Ti, Ru, W or Al, or may be formed of a nitride or oxide of one of these materials, or a laminated material including these materials. It is desirable that the foundation layer 15 should have a uniform thickness at the bottom of the via hole 14, and on the preset region of the insulating film 13 on which the wiring layer is to be provided.

Figure 2C:
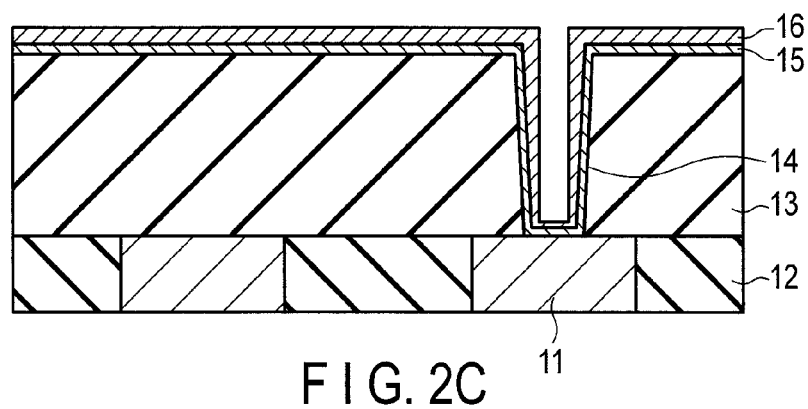

Thereafter, as shown in FIG. 2C, the catalytic layer 16 for growing the CNT and the graphene layer is formed on the foundation layer 15. The catalytic layer 16 is preferably formed of a single metal, such as Co, Ni, Fe, Ru or Cu, or an alloy of at least two of these materials, or a carbide of these materials.

It is desirable that the catalytic layer 16 for growing the CNT 17 should be a perforated film including discrete film portions. In contrast, for growing the graphene layer 18, the catalytic layer 16 should be a continuous film with no dispersed portions. Therefore, it is desirable that at the bottom of the via hole 14 from which the CNT is grown, the catalytic layer 16 should have a thickness that results in a perforated film, while on the insulating film 13 from which the graphene layer as a wiring layer is grown, the catalytic layer 16 should have a thickness that results in a continuous film. As a film forming method suitable for such a film thickness control as the above, PVD (physical vapor deposition) of a low embedding performance, for example, can be used. The method of forming the catalytic layer 16 will be described later in detail.

Figure 2D:
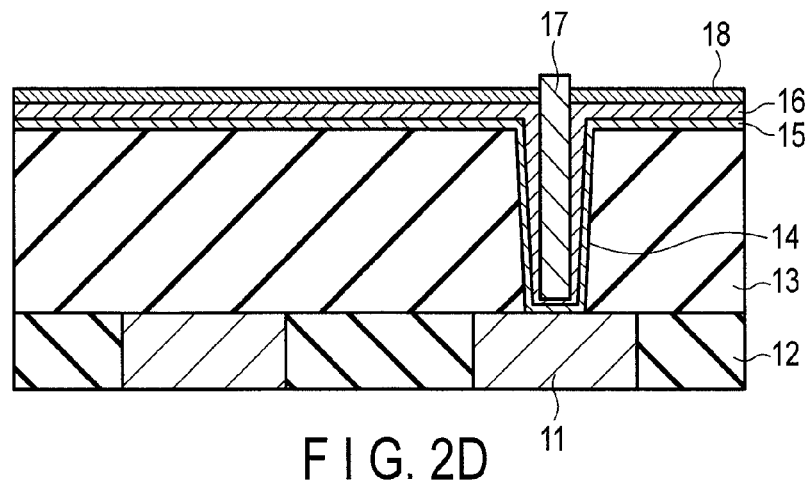

Thereafter, as shown in FIG. 2D, the CNT 17 serving as a contact via and the graphene layer 18 are formed. The CNT 17 and the graphene layer 18 are formed by CVD. As a carbon source, a hydro carbon based gas, such as methane gas or acetylene gas, or a mixture gas thereof, is used, and as a carrier gas, hydrogen gas or noble gas is used. The CNT 17 is formed only on a perforated portion of the catalytic layer 16, while the graphene layer 18 is formed only on a continuous portion of the catalytic layer 16. Thus, the CNT 17 is formed in the via hole 14, and the graphene layer 18 is formed on the upper surface of the insulating film 13. Further, the upper portion of the CNT 17 is in direct contact with the graphene layer 18.

Subsequently, as shown in FIG. 2E, the cap layer 19 is formed on the entire upper surfaces of the CNT 17 and the graphene layer 18. The cap layer 19 is formed to prevent the graphene layer 18 as a wiring layer from having defects during a process later. The cap layer 19 is formed of, for example, SiCN.

After that, as shown in FIG. 2F, the graphene layer 18 is processed by lithography and RIE (not shown), thereby forming the wiring layer 21 connected to the CNT 17 as the contact via, and the separate wiring layer 21a.

Figure 2G:
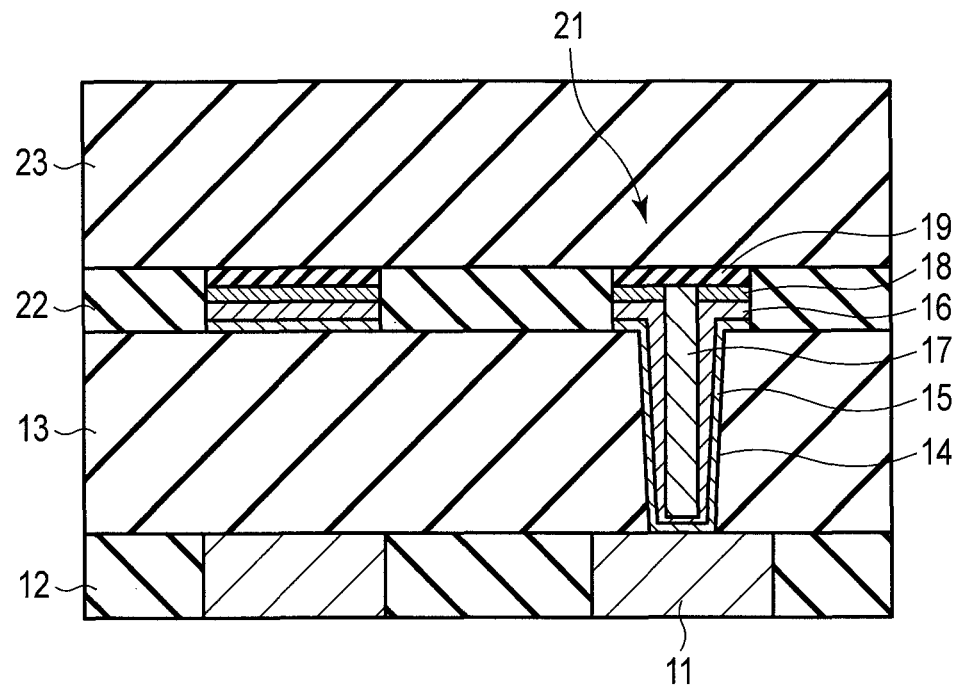

Further, as shown in FIG. 2G, the insulating film 22 for insulating the wiring layers 21 and 21a, and the insulating film 23, are formed.

Lastly, as shown in FIG. 1, an upper contact layer 24 connected to the wiring layer 21a is formed in the insulating film 23.

(Method (1) for Forming the Catalytic Layer)

As described above, it is desirable that the catalytic layer 16 formed at the bottom of the via hole 14 should be a discontinuous (perforated) film, and that the catalytic layer 16 for forming the graphene layer 18 should be a continuous film. The method of forming the catalytic layer 16 as the above will be described.

To form the discontinuous film, PVD is utilized as mentioned above.

Figure 3A:
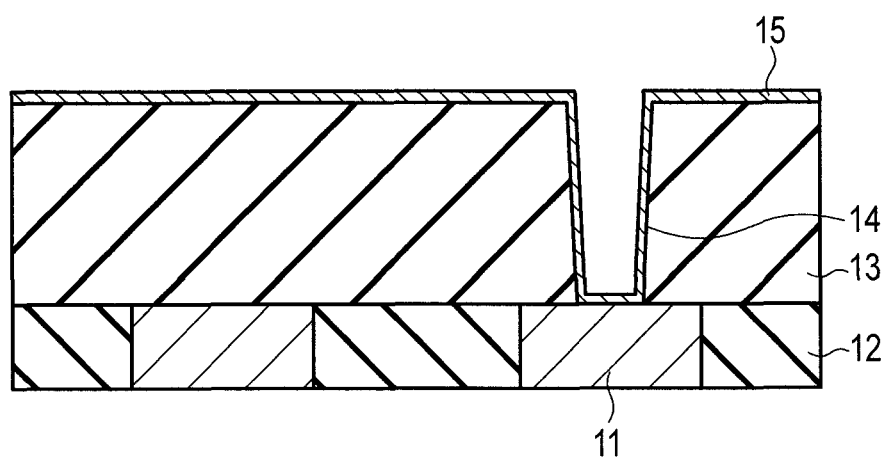
FIG. 3A is a cross sectional view illustrating an example of a process for manufacturing a catalytic layer.

As shown in FIG. 3A, the foundation layer 15 is formed on the entire surface of the insulating film 13 including the interior of the via hole 14.

Figure 3B:
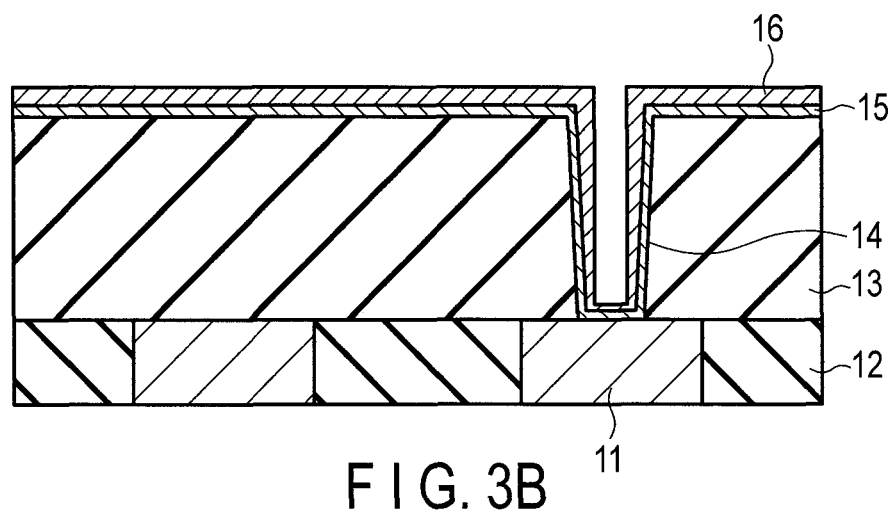
FIG. 3B is a cross sectional view illustrating a process step subsequent to the process step of FIG. 3A.

After that, as shown in FIG. 3B, the catalytic layer 16 is formed by PVD. Since PVD exhibits a low embedding performance, the thickness of the portion of the catalytic layer 16 that is formed at the bottom of the via hole 14 is thinner than the portions of the catalytic layer 16 that are formed on the upper edge of the via hole 14 and on the upper surface of the insulating film 13. Thus, the catalytic layer 16 at the bottom of the via hole 14 can be made to have a thickness that enables the layer 16 to be a discontinuous film, and the catalytic layer 16 on the wiring layer forming region can be made to have a thickness that enables the layer 16 to be a continuous film.

The film forming realized by PVD can simultaneously achieve the forming of the catalytic layer 16 as a discontinuous film at the bottom of the via hole 14, and the forming of the catalytic layer 16 as a continuous film on the wiring layer forming region by one process, thereby reducing the number of required manufacturing process steps.

(Method (2) for Forming the Catalytic Layer)

Since the above-mentioned film forming method using PVD exhibits a low embedding performance, no film can be formed at the bottom of a via hole if this via hole has a high aspect ratio.

Figure 4A:
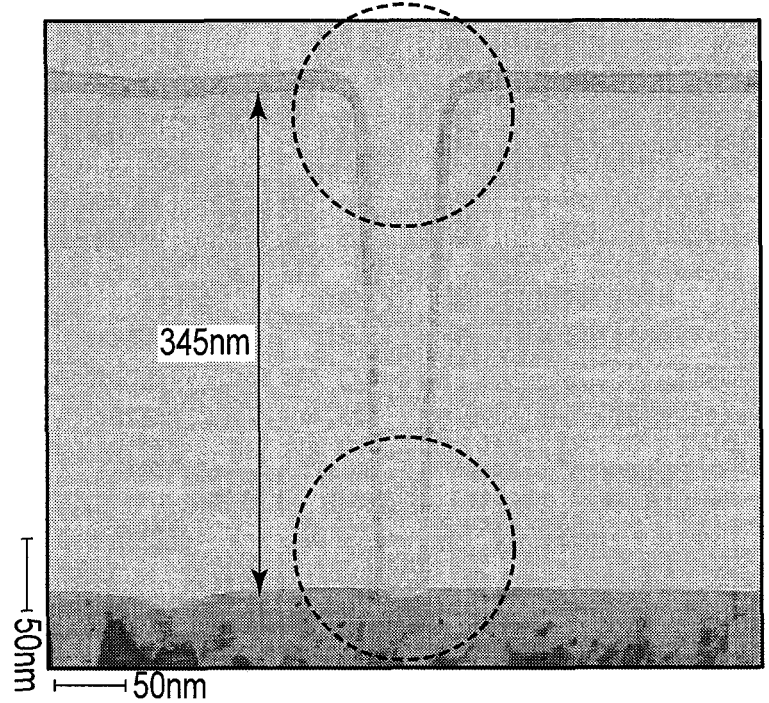
FIG. 4A is an electronic microscope photograph illustrating a case where a catalytic layer is formed by PVD in a via hole of a high aspect ratio.

FIG. 4A shows an example in which for a via hole of a high aspect ratio, a TiN/Ti layer is formed as a foundation layer, and then a cobalt (Co) film is formed as a catalytic layer by PVD.

The catalytic layer of Co formed by PVD is provided only outside of the via hole and on the upper edge of the via hole as shown in FIG. 4B, and is not provided at the bottom of the via hole as shown in FIG. 4C. At the bottom of the via hole, only the TiN/Ti layer as the foundation layer is formed.

Thus, if a catalytic layer is formed for a via hole of a high aspect ratio, a catalytic layer as a perforated film and a catalytic layer as a continuous film can be formed at the bottom of the via hole and on the wiring layer forming region outside the via hole, respectively, by two film forming steps using CVD excellent in embedding property and using PVD.

Namely, as shown in FIG. 5A, the foundation layer 15 is formed on the entire insulating film 13 including the interior of the via hole 14 having a high aspect ratio.

After that, as shown in FIG. 5B, the catalytic layer 16 is formed by CVD. Since CVD is excellent in embedding performance, it can provide, at the bottom of the via hole 14, a catalytic layer 16 of a thickness that makes the layer perforated.

Subsequently, as shown in FIG. 5C, a further catalytic layer 16 is formed by PVD on the catalytic layer 16 that is already formed on the insulating film 13. As a result, the catalytic layers 16 are formed as a single continuous film on the insulating film 13 including the wiring layer forming region.

By thus using CVD and PVD, a catalytic layer 16 of a thickness that makes the layer perforated can be formed at the bottom of the via hole 14, and a catalytic layer 16 of a thickness that makes the layer continuous can be formed on the insulating film 13 including the wiring layer forming region, in addition to another catalytic layer 16 formed on the same by CVD.

According to the first embodiment, the foundation layer 15 and the catalytic layer 16 are formed at the bottom and peripheral wall of the via hole 14, and on the upper surface of the insulating film 13 around the via hole 14, whereby the CNT 17 is grown from the bottom of the via hole 14, and the graphene layer 18 is formed on the portion of the catalytic layer 16 that is provided on the upper surface of the insulating film 13. By virtue of this structure, the CNT 17 and the graphene layer 18 can be kept in direct contact with each other, and hence the contact resistance between the CNT 17 and the graphene layer 18 can be reduced.

Further, since the portion of the catalytic layer 16 that is formed at the bottom of the via hole 14 is made perforated, and the portion of the catalytic layer 16 that is formed on the upper surface of the insulating film 13 is made continuous, the CNT 17 and the graphene layer 18 can be formed simultaneously, which can reduce the number of the required process steps.

Yet further, using both CVD and PVD, the catalytic layer 16 can be formed as a perforated film at the bottom of the via hole 14 having a high aspect ratio, and be formed as a continuous film on the upper surface of the insulating film 13 including the wiring layer forming region.

Second Embodiment

Graphene is Formed at the Peripheral Wall of a Via Hole Before a CNT is Grown

In the first embodiment, the CNT 17 is formed in the via hole 14. In this case, the CNT 17 may grow from the portion of the catalytic layer 16 that is formed at the peripheral wall of the via hole 14, as well as from the portion of the catalytic layer 16 that is formed at the bottom of the via hole 14.

As shown in FIG. 6, the portion of the CNT 17 grown from the peripheral wall of the via hole 14 does not greatly contribute to the electrical conduction of the contact via, and narrows the portion of the CNT 17 grown from the bottom of the via hole 14. This makes it difficult to reduce the resistance of the CNT 17 functioning as a contact via.

In light of this, in the second embodiment, graphene is formed at the peripheral wall of the via hole 14 before the CNT 17 is grown, thereby preventing the CNT from growing from the peripheral wall of the via hole 14. In order to prevent a CNT from growing from the peripheral wall of the via hole 14, it is sufficient if a single graphene layer is formed. The single graphene layer does not adversely influence the growing region of the CNT 17.

The above structure is formed as follows:

As shown in FIG. 7A, the process of forming the foundation layer 15 and the catalytic layer 16 in the via hole 14 and on the upper surface of the insulating film 13 is similar to that of the first embodiment.

After that, the graphene layer 18 as a wiring layer and the CNT 17 are simultaneously formed by CVD. However, at this time, CVD condition is controlled. Namely, firstly, a condition, such as a plasma CVD of high energy, for forming graphene by priority is employed to form a graphene layer 18a on the portion of the catalytic layer 16 that is provided at the peripheral portion of the via hole 14, and to form a graphene layer 18b on the portion of the layer 16 that is provided on the upper surface of the insulating film 13. The graphene layer 18a at the peripheral wall of the via hole 14 is, for example, a single layer. Further, the graphene layer 18b on the portion of the layer 16 that is provided on the upper surface of the insulating film 13 comprises, for example, two or more layers.

After that, a condition, such as energy-reduced plasma CVD, for forming the CNT 17 by priority is employed to thereby form the CNT 17 in the via hole 14.

Namely, by forming the graphene layer 18a at the peripheral wall of the via hole 14, growing of the CNT 17 from the peripheral wall of the via hole 14 is suppressed and the growing of the CNT 17 from the bottom of the via hole 14 is accelerated as shown in FIG. 7B. Thus, the CNT 17 and the graphene layer 18 as a wiring layer are kept in direct contact with each other.

FIG. 8 shows the case where the same process as that of the first embodiment is performed after the step of FIG. 7B.

In the above-described second embodiment, the graphene 18a is formed at the peripheral wall of the via hole 14, thereby suppressing growing of the CNT 17 from the peripheral wall of the via hole 14. As a result, a sufficient CNT 17 can be grown from the bottom of the via hole 14, and therefore the resistance of the contact via can be reduced.

Moreover, since the graphene 18a is formed at the peripheral wall of the via hole 14, the contact area between the CNT 17 and the whole graphene layer (18a and 18b) is greater than that of the first embodiment, thereby reducing the contact resistance compared to the first embodiment.

Yet further, the graphene layer 18a at the peripheral wall of the via hole 14 and the graphene layer 18b on the upper surface of the insulating film 13 can be formed simply by controlling the energy of plasma CVD. This facilitates the manufacturing process.

Third Embodiment

A Facet is Formed at a Catalytic Layer and a Graphene Layer is Formed at the Peripheral Wall of a Via Hole In the second embodiment, the graphene layer 18a is formed at the peripheral wall of the via hole 14 by controlling the energy of plasma CVD.

A third embodiment is another example for forming the graphene layer 18a at the peripheral wall of the via hole 14.

As shown in FIG. 9A, the portion of the catalytic layer 16 provided at the peripheral wall of the via hole 14 is thinner than the portion of the catalytic layer 16 provided on the upper surface of the insulating film 13. On the thin portion of the catalytic layer 16, a CNT is more easily formed than a graphene layer.

In view of this, in the third embodiment, the portion of the catalytic layer 16 provided at the peripheral wall of the via hole 14 is made thick to be formed as a continuous film. Further, a facet that may easily serve as a base point for graphene growth is formed on the peripheral wall of the catalytic layer 16.

To thicken the film at the peripheral wall of the via hole 14, via sputtering is, for example, used.

Further, to form a facet on the peripheral wall of the catalytic layer 16, the peripheral wall of the catalytic layer 16 is formed by PVD.

FIG. 9B shows an example where the catalytic layer 16 is formed by PVD. Since PVD exhibits a low embedding performance, the catalytic layer 16 is grown at the peripheral wall of the via hole 14, and a facet is formed at the upper edge of the via hole 14.

After that, a CNT and a graphene layer are formed by CVD as in the first embodiment. At this time, as shown in FIG. 10, the graphene layer 18a is formed on the portion of the catalytic layer 16 formed at the peripheral wall of the via hole 14 below the fact, and the graphene layer 18b is formed on the portion of the catalytic layer 16 on the upper surface of the insulating film 13. Further, a CNT 17 is grown from the bottom of the via hole 14.

According to the third embodiment, since the graphene layer 18b is formed at the peripheral wall of the via hole 14, a sufficient CNT 17 can be grown from the bottom of the via hole 14 as in the second embodiment. Accordingly, the resistance of the contact via can be reduced.

Furthermore, in the third embodiment, the facet formed at the peripheral wall of the via hole 14 is used as a base point for growing the graphene layer 18a at the peripheral wall of the via hole 14 in the process of forming the CNT and graphene by CVD. Thus, the graphene layer 18a can be formed at the peripheral wall of the via hole 14 without greatly changing the manufacturing process.

Fourth Embodiment

A Graphene Layer is Formed on the Upper Edge of a Via Hole Before Growing a CNT

When the CNT 17 as a contact via is formed in the via hole 14, it is difficult to appropriately control the height of the CNT 17, and the CNT 17 may well protrude from the via hole 14. Since the excessively grown CNT 17 becomes a factor for leakage, it is necessary to make the CNT 17 level with the upper edge of the via hole 14. However, the processing selection ratio between the graphene layer 18 and the CNT 17 is low, and hence it is difficult to eliminate only the portion of the CNT 17 positioned above the graphene layer 18. To solve this problem, it is effective to stop growing of the CNT 17 when the height of the CNT 17 reaches the same level as the upper edge of the via hole 14.

FIG. 11A shows the fourth embodiment.

As shown in FIG. 11A, in the fourth embodiment, before the CNT 17 is grown in the via hole 14, the graphene layer 18 is formed on the portions of the catalytic layer 16 provided on the upper edge of the via hole 14 and on the upper surface of the insulating film 13. When the CNT 17 is formed in the via hole 14, the growth of the CNT 17 is controlled so that the top of the CNT 17 will be level with the upper edge of the via hole 14 by the graphene layer 18 formed on the upper edge of the via hole 14.

The above structure can be obtained by the following method:

Firstly, a foundation layer 15 and a catalytic layer 16 are formed on the insulating film 13 in and on which the via hole 14 and the wiring layer are formed, as in the structures shown in FIGS. 2A to 2C.

After that, the graphene layer 18 and the CNT 17 are formed by CVD. At this time, the conditions for CVD are controlled. For instance, firstly, plasma CVD of high energy is performed to form a graphene growth core by priority. Subsequently, the energy is lowered to laterally grow graphene from the graphene growth core, thereby growing graphene from the upper edge of the via hole 14. As a result, graphene covers the top of the via hole 14.

Thereafter, the plasma CVD energy is further reduced in order to form the CNT 17 by priority. Under this condition, CVD is performed to thereby form the CNT 17 on the portion of the catalytic layer 16 provided at the bottom of the via hole 14.

More specifically, by the low energy plasma CVD, carbon atoms and a carrier gas enter the via hole 14 through the graphene layer 18 covering the top of the via hole 14, whereby growth of the CNT 17 from the bottom of the via hole 14 advances.

Thus, as shown in FIG. 11B, the CNT 17 grows in the via hole 14, and the growth of the CNT 17 stops when it is brought into contact with the graphene layer 18 covering the top of the via hole 14.

FIG. 12 shows a case where the same process steps as those of the first embodiment are performed after the process step of FIG. 11B.

Although it is desirable to entirely cover the top of the via hole 14 by the graphene layer 18, at least a part of the top of the via hole 14 may be covered.

According to the fourth embodiment, when the graphene layer 18 and the CNT 17 are formed, firstly, the top of the via hole 14 is covered with the graphene layer 18 by, for example, plasma CVD of high energy, and then the CNT 17 is formed in the via hole 14 by plasma CVD of low energy. Accordingly, the height of the CNT 17 can be adjusted by the graphene layer 18, thereby preventing the CNT 17 from projecting from the via hole 14.

Moreover, since the forming of the graphene layer 18 and the CNT 178 can be controlled by controlling the energy of plasma CVD, the semiconductor device can be easily produced.

Furthermore, when CNTs are formed in via holes of different depths, they can be formed in accordance with the respective depths of the via holes in the fourth embodiment.

Fifth Embodiment

A CNT and a Graphene Layer are Bonded by a Heat Treatment

In the first to fourth embodiments, the CNT 17 as a contact via and the graphene layer 18 as a wiring layer can be made in direct contact with each other. However, the CNT 17 and the graphene layer 18, which are in direct contact with each other, are not bonded.

The fifth embodiment proposes a process of bonding the CNT 17 and the graphene layer 18 by a heat treatment after they are formed.

FIG. 13A shows a structure similar to that of FIG. 2E. Namely, in the via hole 14, the CNT 17 as the contact via is formed, and on the upper surface of the insulating film 13, the graphene layer 18 as the wiring layer is formed. Further, on the entire surface of the resultant structure, a cap layer 19 made of, for example, SiCN is formed.

Subsequently, a heat treatment is performed at a temperature of, for example, 600° C. for a time period of, for example, 1 minute. By this heat treatment, the crystalline structure of the boundary of the CNT 17 and the graphene layer 18 is changed. Thereby, the CNT 17 and the graphene layer 18 are bonded.

FIG. 13B shows a state in which a wiring layer is formed by lithography and etching after the heat treatment.

According to the fifth embodiment, after the CNT 17 and the graphene layer 18 are formed, they are heated to be connected to each other. This reduces the contact resistance between the CNT 17 and the graphene layer 18, whereby lower resistance wiring can be realized.

Sixth Embodiment

A CNT and a Graphene Layer are Connected by a Core Member

In the first to fourth embodiments, the CNT 17 as the contact via and the graphene layer 18 as the wiring layer can be put into direct contact with each other. However, there is a case where the contact area between the CNT 17 and the graphene layer 18 is very small. Where the contact area is small, the contact resistance is high.

In view of this, in the sixth embodiment, the CNT 17 as the contact via and the graphene layer 18 as the wiring layer are electrically and physically connected to each other by a core member 30 as shown in FIG. 14. The core member 30 is formed of a conductive material that exhibits a low resistance to a nano carbon material. For instance, the core member may be formed of Ti, Co, Ni, Pd or C, for example. It is not necessary to bury the entire wiring layer or contact via. It is sufficient if the core member is formed at the contact portion between the CNT 17 and the graphene layer 18.

FIGS. 15A to 15E show a manufacturing method according to the sixth embodiment.

FIG. 15A is similar to FIG. 2D and shows a state in which the CNT 17 as the contact via is formed in the via hole 14, and the graphene layer 18 as the wiring layer is formed on the upper surface of the insulating film 13.

Subsequently, as shown in FIG. 15B, the core member 30, which is formed of a conductive member of, for example, Ti, Co, Ni, Pd or C, is provided on the entire resultant structure. The core member 30 electrically and physically connects the CNT 17 to the graphene layer 18.

After that, as shown in FIG. 15C, a cap layer 19 is formed on the core member 30.

Thereafter, as shown in FIG. 15D, wiring layers 21 and 21*a* are formed by lithography and etching.

After that, as shown in FIG. 15E, insulating films 22 and 23 are formed.

In the sixth embodiment, the core member 30 for electrically and physically connecting the CNT 17 to the graphene layer 18 is formed. Since the core member 30 increases the contact area between the CNT 17 and the graphene layer 18, the contact resistance therebetween is reduced.

Seventh Embodiment

CNTs are Formed in Via Holes of Different Depths

In general, when CNTs are formed in via holes of different depths, the CNTs are adjusted to grow to the same level. Therefore, if CNTs are formed based on the depth of a deeper via hole, a CNT in a shallower via hole will excessively grow, which makes it difficult to perform subsequent processes. In contrast, if CNTs are formed based on the depth of a shallower via hole, a CNT in a deeper via hole will not reach the top of the via hole, which may cause an open state in which the CNT and the graphene layer are not connected.

Figure 16:
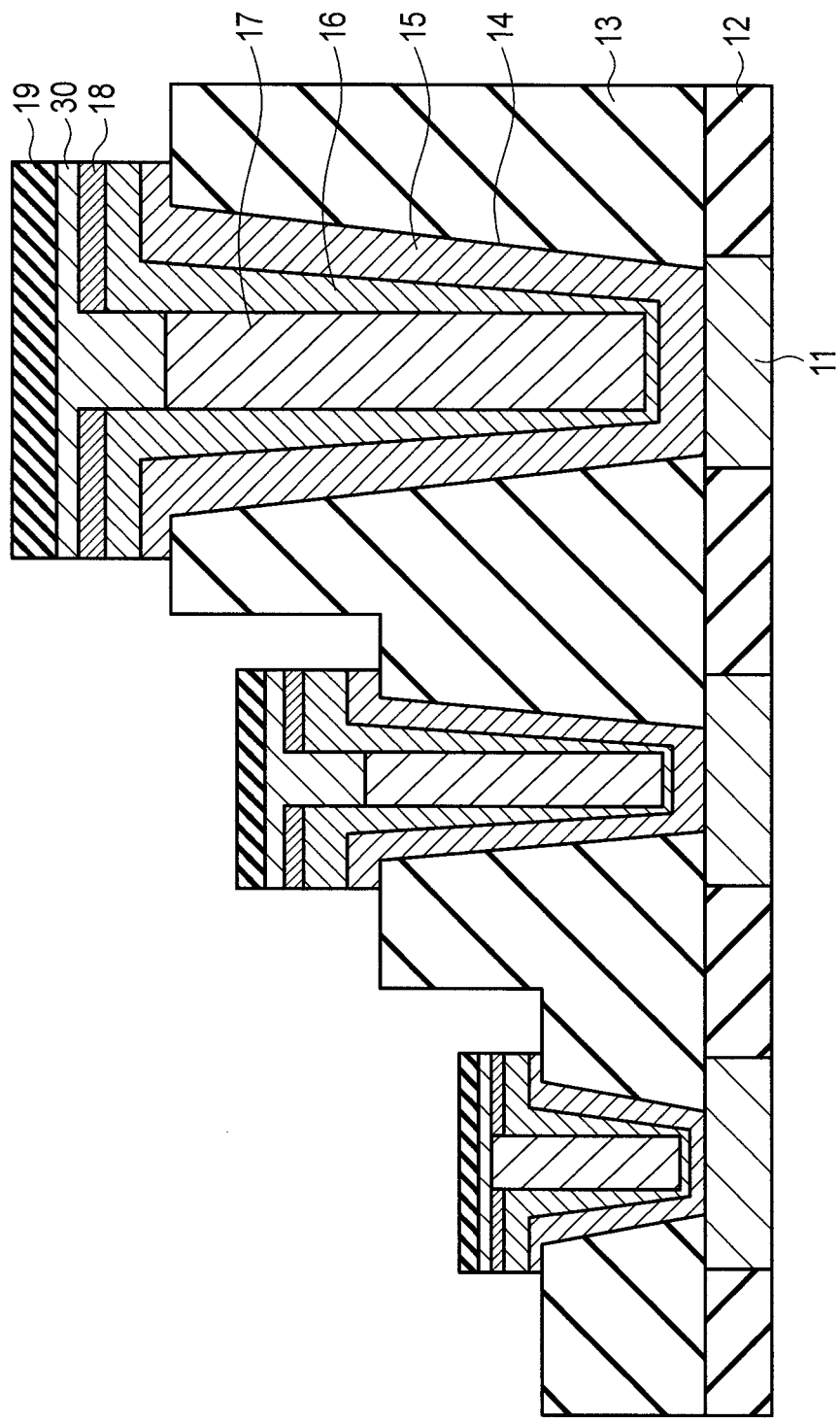
FIG. 16 is a cross sectional view illustrating a semiconductor device according to a seventh embodiment.

In light of the above, in the seventh embodiment, as shown in FIG. 16, the CNTs 17 are formed based on a shallow via hole, and thereafter the core members 30 are formed as in the sixth embodiment. A larger core member 30 is formed in a greater diameter via hole. Since the diameter of a deeper via hole is greater than that of a shallower via hole, in the deeper via hole, the CNT 17 and the graphene layer 18 are sufficiently connected to each other by the corresponding core member 30. Further, also in the shallower via hole, the CNT 17 and the graphene layer 18 may be connected to each other by the corresponding core member 30. By virtue of this structure, CNTs 17 can be formed in a plurality of via holes having different depths.

According to the seventh embodiment, by forming core members 30 after forming the CNTs 17 based on a shallow via hole, in a deeper via hole, the CNT 17 and the graphene layer 18 are sufficiently connected to each other by the corresponding core member 30. Thus, in a plurality of via holes having different depths, the CNT 17 and the graphene layer 18 are sufficiently connected in each via hole. This prevents a deeper via hole from having an open state in which the CNT and the graphene layer are not connected.

Although the first to seventh embodiments, a CNT is formed in a via hole, and a graphene layer is formed on the upper surface of an insulating film, the embodiments are not limited to this structure, but is also applicable to a case where a CNT is selectively grown into a via hole.

Eighth Embodiment

Selective Growth of CNT

In general, when a CNT is formed in a via hole by CVD, it is formed not only in the via hole but also on the upper surface of an insulating film. When the CNT is thus formed on the entire surface of the insulating film including the interior of the via hole, it is difficult to perform subsequent processes.

However, when the CNT and graphene layer forming methods described in the first to seventh embodiments are employed, the CNT 17 is formed only within the via hole 14, and the graphene layer 18 is formed on the upper surface of the insulating film with no CNT formed thereon. Thus, the CNT 17 is selectively formed within the via hole 14.

FIG. 17A shows the eighth embodiment.

In the eighth embodiment, a catalytic layer 16 as a perforated film is formed at the bottom of the via hole 14, and a catalytic layer 16 as a continuous film is formed on the upper surface of the insulating film 13, as in the first to seventh embodiments. Subsequently, the CNT 17 is formed in the via hole 14, and a graphene layer 18 is formed above the upper surface of insulating film 13. The graphene layer is formed of a graphene sheet structure comprising one to several tens of graphene sheets, the thickness of each sheet being 0.34 nm that is extremely thinner than the height of the CNT 17. After that, the portion of the graphene layer provided on the upper surface of the insulating film 13 is removed by CMP.

FIG. 17B is a cross sectional view taken after the CMP. By the CMP, the graphene layer 18, the catalytic layer 16, the foundation layer 15, and the portion of the CNT 17 provided at the top of the via hole 14, are removed by CMP, whereby the CNT 17 is selectively formed in the via hole 14.

In the eighth embodiment, a catalytic layer 16 as a perforated film is formed at the bottom of the via hole 14, a catalytic layer 16 as a continuous film is formed on the upper surface of the insulating film 13, the CNT 17 is formed in the via hole 14 by CVD, and the graphene layer 18 is formed on the upper surface of the insulating film 13, and then the graphene layer 18 on the upper surface of the insulating film 13 is removed by CMP. Thus, the CNT 17 can be selectively formed within the via hole 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an insulating film with a hole;
   a catalytic layer formed at a bottom of the hole, at a peripheral wall of the hole, and on an upper surface of the insulating film outside the hole;
   a contact formed by means of a carbon nanotube on a portion of the catalytic layer provided at the bottom of the hole; and
   a wiring layer formed of graphene and provided in contact with the carbon nanotube on the upper surface of a portion of the catalytic layer outside the hole,
   the portion of the catalytic layer provided at the bottom of the hole being a perforated film, the portion of the catalytic layer outside the hole being a continuous film.

2. The device according to claim 1, wherein the portion of the catalytic layer provided at the bottom of the hole is thinner than the portion of the catalytic layer outside the hole.

3. The device according to claim 2, further comprising a graphene layer formed between the portion of the catalytic layer provided at the peripheral wall of the hole, and the contact.

4. The device according to claim 3, wherein the portion of the catalytic layer provided at the peripheral wall of the hole includes a facet.

5. The device according to claim 1, further comprising another wiring layer covering a top of the hole, formed of graphene and connected to the first-mentioned wiring layer that is formed of graphene and provided outside the hole.

6. The device according to claim 1, wherein the portion of the catalytic layer outside the hole has a thickness not less than 5 nm, and the portion of the catalytic layer provided at the bottom of the hole is less than 5 nm.

7. The device according to claim 1, wherein the portion of the catalytic layer provided at the peripheral wall of the hole is thicker than the portion of the catalytic layer provided at the bottom of the hole.

8. The device according to claim 5, wherein the another wiring layer formed of graphene and covering the top of the hole is electrically and mechanically connected to the contact formed of the carbon nanotube.

9. The device according to claim 5, further comprising a core member for electrically and mechanically connecting the contact formed of the carbon nanotube to the another wiring layer covering the top of the hole.

10. The device according to claim 9, wherein the insulating film includes a first hole and a second hole, and the first hole is shallower than the second hole, the first hole containing a first contact formed of a carbon nanotube, the second hole containing a second contact formed of another carbon nanotube and a core member provided on the another carbon nanotube.

11. A semiconductor device comprising:
    an insulating film with a hole;
    a catalytic layer formed at a bottom of the hole, at a peripheral wall of the hole, and on an upper surface of the insulating film outside the hole;
    a contact formed by means of a carbon nanotube on a portion of the catalytic layer provided at the bottom of the hole;
    a wiring layer formed of graphene and provided in contact with the carbon nanotube on the upper surface of a portion of the catalytic layer outside the hole; and
    a graphene layer formed between the contact and the portion of the catalytic layer provided at the peripheral wall of the hole,
    the portion of the catalytic layer provided at the bottom of the hole being a perforated film, the portion of the catalytic layer outside the hole being a continuous film, the portion of the catalytic layer provided at the bottom of the hole being thinner than the portion of the catalytic layer outside the hole, and having a facet.

12. A semiconductor device manufacturing method comprising:
    forming an insulating film with a hole;
    forming a catalytic layer at a bottom of the hole, at a peripheral wall of the hole, and on an upper surface of the insulating film outside the hole; and
    forming a contact by means of a carbon nanotube on a portion of the catalytic layer provided at the bottom of the hole,
    the portion of the catalytic layer provided at the bottom of the hole being a perforated film, the portion of the catalytic layer outside the hole being a continuous film.

13. The method according to claim 12, wherein the portion of the catalytic layer provided at the bottom of the hole is thinner than the portion of the catalytic layer outside the hole.

14. The method according to claim 13, the catalytic layer is formed by physical vapor deposition (PVD).

15. The method according to claim 13, wherein the catalytic layer is formed by chemical vapor deposition (CVD) at the bottom of the hole, and is then formed by PVD on the upper surface of the insulating film outside the hole.

16. The method according to claim 12, further comprising a graphene layer formed between the portion of the catalytic layer provided at the peripheral wall of the hole, and the contact.

17. The method according to claim 12, further comprising forming a facet on a portion of the catalytic layer provided at a top of the hole, and forming a graphene layer on a portion of the catalytic layer provided at the peripheral wall of the hole below the facet.

18. The method according to claim 12, further comprising growing the carbon nanotube at the bottom of the hole after forming a graphene layer on a top of the hole.

19. The method according to claim 12, further comprising forming the carbon nanotube and a graphene layer, and then heating the carbon nanotube and the graphene layer to couple the carbon nanotube to the graphene layer.

20. The method according to claim 12, further comprising forming the carbon nanotube and a graphene layer, and then forming a conductive member for connecting the carbon nanotube to the graphene layer.

21. The method according to claim 19, further comprising forming, in the insulating film, a plurality of holes of different depths, then growing carbon nanotubes in the holes with reference to a shallowest hole among the holes, and forming conductive members for connecting the carbon nanotubes to the graphene layer after forming the graphene layer.

* * * * *